(12) United States Patent
Takada et al.

(10) Patent No.: US 9,306,137 B2
(45) Date of Patent: Apr. 5, 2016

(54) METHOD OF PRODUCING CRYSTALLINE SUBSTRATE HAVING CONCAVE-CONVEX STRUCTURE

(75) Inventors: Susumu Takada, Otsu (JP); Emi Kuraseko, Otsu (JP); Motoyuki Suzuki, Otsu (JP)

(73) Assignee: Toray Industries, Inc. (JP)

( * ) Notice: Subject to any disclaimer, the term of this patent is extended or adjusted under 35 U.S.C. 154(b) by 29 days.

(21) Appl. No.: 14/395,151

(22) PCT Filed: Aug. 9, 2012

(86) PCT No.: PCT/JP2012/070362
§ 371 (c)(1),
(2), (4) Date: Oct. 17, 2014

(87) PCT Pub. No.: WO2013/161095
PCT Pub. Date: Oct. 31, 2013

(65) Prior Publication Data
US 2015/0097204 A1   Apr. 9, 2015

(30) Foreign Application Priority Data

Apr. 26, 2012   (JP) .................................. 2012-101005

(51) Int. Cl.
*H01L 33/58* (2010.01)
*H01L 33/22* (2010.01)
(Continued)

(52) U.S. Cl.
CPC .............. *H01L 33/58* (2013.01); *B32B 37/025* (2013.01); *B32B 38/10* (2013.01); *C30B 33/08* (2013.01);
(Continued)

(58) Field of Classification Search
CPC .................. H01L 2924/0002; H01L 21/0237; H01L 21/0242; H01L 21/0243; H01L 21/02433; H01L 21/02458; H01L 21/0254; H01L 21/0262; H01L 2924/00; H01L 33/007; H01L 33/0079; H01L 21/02343; H01L 21/02389

USPC .................... 438/597, 110, 46, 47, 478, 488; 257/E21.09, E21.119, E21.127, 257/E29.004, E29.168, 49
See application file for complete search history.

(56) References Cited

U.S. PATENT DOCUMENTS 5,925,931 A * 7/1999 Yamamoto .......... H01L 23/3114
257/737
6,326,299 B1 * 12/2001 Homma .................... C09G 1/02
257/E21.304

(Continued)

FOREIGN PATENT DOCUMENTS

JP     2004-349365 A   12/2004
JP     2009-054882 A    3/2009

(Continued)

OTHER PUBLICATIONS

"Single crystal wafers applied for surface acoustic wave device," 2005, pp. 1-29 with English counterpart as International Standard IEC 62276 ed 1.0.

*Primary Examiner* — Stephen W Smoot
*Assistant Examiner* — Edward Chin
(74) *Attorney, Agent, or Firm* — DLA Piper LLP (US)

(57) ABSTRACT

A method of producing the crystalline substrate having a concave-convex structure includes: (A) forming a transfer film by forming a concave-convex film on a support film on the surface having a concave-convex pattern thereon so that thickness of the residual film of the concave-convex film is 0.01 to 1 μm, the concave-convex pattern of the support film having concave parts with a width of 0.05 to 100 μm, a depth of 0.05 to 10 μm, and a ratio of the depth of the concave part to the width of the concave part of up to 1.5, (B) disposing the transfer film on the crystalline substrate, and transferring the concave-convex film onto the crystalline substrate to produce a crystalline substrate having the concave-convex film thereon, (C) etching the crystalline substrate having the concave-convex film thereon to form a concave-convex structure on the surface of a crystalline substrate.

20 Claims, 5 Drawing Sheets

(51) Int. Cl.
    *C30B 33/08*     (2006.01)
    *B32B 37/00*     (2006.01)
    *B32B 38/10*     (2006.01)
    *H01L 33/00*     (2010.01)

(52) U.S. Cl.
    CPC ......... *H01L 33/22* (2013.01); *B32B 2310/0831* (2013.01); *B32B 2323/00* (2013.01); *B32B 2333/00* (2013.01); *B32B 2361/00* (2013.01); *B32B 2379/08* (2013.01); *B32B 2457/20* (2013.01); *H01L 33/005* (2013.01); *H01L 2933/0058* (2013.01)

(56) References Cited

U.S. PATENT DOCUMENTS

| | | | |
|---|---|---|---|
| 6,835,595 B1* | 12/2004 | Suzuki | H01L 21/56 257/701 |
| 8,324,738 B2* | 12/2012 | Liu | H01L 24/11 257/781 |
| 2002/0137249 A1* | 9/2002 | Ishida | H01L 21/0237 438/47 |
| 2003/0194834 A1* | 10/2003 | Watase | H01L 23/3114 438/109 |
| 2004/0004765 A1* | 1/2004 | Ihara | G02B 5/124 359/530 |
| 2005/0129979 A1* | 6/2005 | Kambe | H01L 51/004 428/690 |
| 2011/0012109 A1* | 1/2011 | Krylıouk | H01L 21/0237 257/49 |
| 2011/0101527 A1* | 5/2011 | Cheng | H01L 24/11 257/738 |
| 2011/0254161 A1* | 10/2011 | Hu | H01L 24/05 257/738 |
| 2014/0162406 A1* | 6/2014 | Cho | H01L 21/6835 438/110 |
| 2014/0242782 A1* | 8/2014 | Cho | H01L 21/02343 438/478 |

FOREIGN PATENT DOCUMENTS

| | | |
|---|---|---|
| JP | 2009-246019 A | 10/2009 |
| JP | 2011-096935 A | 5/2011 |
| WO | 2010/007853 A1 | 1/2010 |
| WO | 2012/043828 A1 | 4/2012 |

* cited by examiner

METHOD OF PRODUCING CRYSTALLINE SUBSTRATE HAVING CONCAVE-CONVEX STRUCTURE

TECHNICAL FIELD

This disclosure relates to a method of producing a crystalline substrate having a concave-convex structure.

BACKGROUND

Known methods of producing a crystalline substrate having a concave-convex structure include (A) and (B).

(A) Lithography Technique

Lithography technique is a process wherein a resist is patterned by exposure to an energy ray irradiated through a mask formed with a pattern, and subsequent development.

Patterning of a resist film 18 by lithography technique comprises the step of applying a resist film 18 on the surface of a crystalline substrate 13 by spin coating wherein a coating solution is thinly spread by using centrifugal force (FIG. 8-$a$ shows the state having the resist film 18 applied), and the step of exposure and development using an exposure apparatus (FIG. 8-$b$ shows the crystalline substrate 13 having the patterned resist film 18 after the development). A crystalline substrate having a concave-convex structure 15 is formed by conducting etching of the crystalline substrate 13 using the resist film 18 which has been patterned by the lithography technique as a mask. The resist film 18 remaining on the surface of a crystalline substrate having a concave-convex structure 15 is subsequently removed (FIG. 8-$c$ shows the crystalline substrate having a concave-convex structure 15 having the remaining resist film 18 removed). The crystalline substrate having a concave-convex structure thereon is thereby produced.

Precision in the patterning of the surface of a crystalline substrate used in a semiconductor device is generally determined by the minimum line width that can be formed on the resist film. The decrease in the minimum line width of the resist is known to be associated with a substantial decrease in the depth of focus of the exposure apparatus. The depth of focus is the range within which the optical system is substantially in focus.

This in turn means that, in the lithography technique, a decrease in the minimum line width of the resist patterning is associated with an uneven thickness of the resist film in the area where evenness of the crystalline substrate had been insufficient and, in such area, the surface of the resist film is no longer within the range of the depth of focus of the optical system of the exposure apparatus. The uneven thickness and width of the concave-convex structure of the resist film also results in the uneven height and width of the concave-convex structure formed on the surface of the crystalline substrate in the etching of the crystalline substrate, and yield and performance of the product are damaged in the area where the desired dimension has not been realized.

In addition, evenness of the crystalline substrate surface usually decreases with an increase in the diameter of the crystalline substrate, and as widely known, this in turn means that the increase in the diameter of the crystalline substrate inevitably invites adverse effects on the product yield and product performance. Typical indices for such surface evenness of the crystalline substrate are (i) TTV (total thickness variation) which is the proportion of the minimum thickness of the crystalline substrate in relation to the maximum thickness of the entire crystalline substrate, (ii) LTV (local thickness variation) which is the height of the local protrusion and recess in the crystalline substrate, and (iii) warp of the crystalline substrate (Single crystal wafers applied for surface acoustic wave (SAW) device applications—Specification and use guide, December 2005, Quartz Crystal Industry Association of Japan, pp. 5-6). For example, in the sapphire crystalline substrate which is commonly used for the growth of the light-emitting layer of a light-emitting diode, the thickness is 50 to 1000 µm, the TTV is 1 to 25 µm, the LTV is 1 to 15 µm, and the warp is −25 to 25 µm.

(B) Imprinting Technique

The imprinting technique is a process wherein patterning of the resist is accomplished by the very simple process of pressing of the mold. The imprinting technique includes thermal imprinting and UV (ultraviolet) imprinting.

The patterning of the resist film 18 by the thermal imprinting technique comprises the step of forming a resist film 18 having thermoplastic or thermosetting property by a spin coating method wherein the coating solution is thinly spread on the surface of the crystalline substrate 13 by using centrifugal force (FIG. 9-$a$ shows the state having the resist film 18 applied), and the step of heating the mold and the resist film 18 to a temperature higher than the glass-transition temperature of the resist film 18 and pressing the mold against the resist film 18, and then cooling the mold and the resist film 18 to a temperature equal to or below the glass-transition temperature of the resist film 18, and releasing the mold from the resist film 18 (FIG. 9-$b$ shows the crystalline substrate 13 provided with the patterned resist film 18 after the release of the mold).

The patterning of the resist film 18 by the UV (ultraviolet) imprinting technique comprises forming a resist film 18 having UV (ultraviolet) setting property by spin coating method wherein the coating solution is thinly spread on the surface of the crystalline substrate 13 by using centrifugal force (FIG. 9-$a$ shows the state having the resist film 18 applied), and pressing the mold against the resist film 18 and irradiating the UV (ultraviolet) beam to cure the resist film 18 and releasing the mold from the resist film 18 (FIG. 9-$b$ shows the crystalline substrate 13 provided with the patterned resist film 18 after the release of the mold).

The crystalline substrate having a concave-convex structure 15 is then produced by etching the crystalline substrate 13 using the resist film 18 patterned by the imprinting technique for the mask and, subsequently, the resist film 18 remaining on the surface of the crystalline substrate having a concave-convex structure 15 is removed (FIG. 9-$c$ shows the crystalline substrate having a concave-convex structure 15 having the remaining resist film 18 removed). The crystalline substrate having a concave-convex structure is thereby produced (Japanese Unexamined Patent Publication (Kokai) No. 2009-54882). However, the imprinting technique has the drawback that the mold is incapable of following the crystalline substrate in the area where the evenness of the crystalline substrate is insufficient, and this invites uneven thickness of the resist film. The uneven thickness of the resist film means that, when the crystalline substrate is etched, the height of the concave-convex structure formed on the surface of the crystalline substrate becomes uneven, and that the yield and the performance of the product is reduced in the area where the desired dimension is not realized.

As described above, the evenness of the crystalline substrate has great influence on the yield and performance of the product in the production method of the crystalline substrate having a concave-convex structure in both of the methods (A) and (B).

In view of such situation, a technique of selectively polishing the protrusion of the crystalline substrate has been proposed.

More specifically, the technique is a process comprising the steps of detecting protrusions on the surface of the crystalline substrate and flattening the protrusions by local mechanical polishing, washing and drying the crystalline substrate for dust removal, and patterning the resist (Japanese Unexamined Patent Publication (Kokai) No. 2011-96935). However, the technique of selectively polishing the local protrusions on the crystalline substrate requires complicated and less-productive step of selective polishing of the protrusions on the crystalline substrate, and this technique can be used only in limited range of applications.

It could therefore be helpful to provide a method of producing a crystalline substrate having a concave-convex structure which can be conducted by a simple process, and which can be used even if the crystalline substrate has a large diameter.

SUMMARY

The method of producing a crystalline substrate having a concave-convex structure comprises the following steps (A) to (C):

(A) forming a transfer film by forming a concave-convex film on a support film on the surface having a concave-convex pattern thereon so that thickness h of the residual film of the concave-convex film is 0.01 to 1 μm, the concave-convex pattern of the support film having concave parts with a width w of 0.05 to 100 μm, a depth d of 0.05 to 10 μm, and a ratio d/w of the depth d of the concave part to the width w of the concave part of up to 1.5, (B) disposing the transfer film on the crystalline substrate, and transferring the concave-convex film onto the crystalline substrate to produce a crystalline substrate having the concave-convex film thereon, and (C) etching the crystalline substrate having the concave-convex film thereon to form a concave-convex structure on the surface of a crystalline substrate.

We thus provide a method of producing a crystalline substrate having a concave-convex structure thereon, which can be conducted by a simple process, and which can be used even if the crystalline substrate has a large diameter.

EXPLANATION OF NUMERALS

Figure 1:
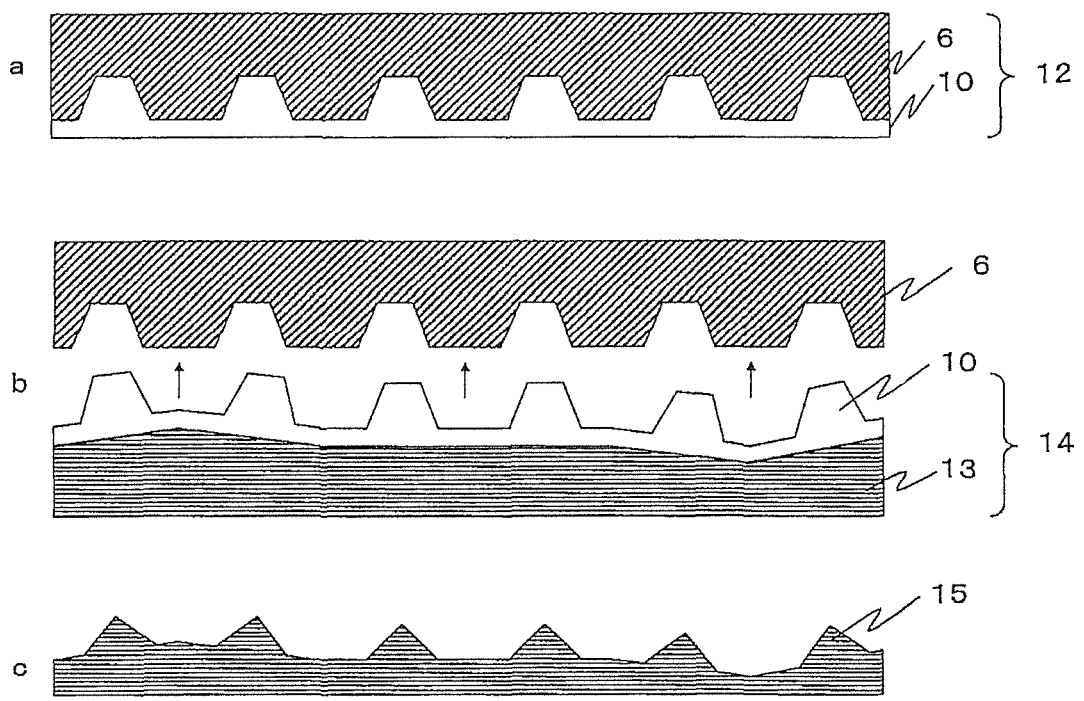
FIGS. 1-a, b and c shows schematic views of the cross section of the transfer film and/or the crystalline substrate in each step of our production method.

1: droplet
2: points at opposite ends of the droplet
3: peak point of the droplet
4: contact angle of the droplet
5: sample
6: support film
7: concave-convex pattern of the support film
8: width of the concave part of the support film
9: depth of the concave part of the support film
10: concave-convex film
11: residual film thickness of the concave-convex film
12: transfer film
13: crystalline substrate
14: crystalline substrate having a concave-convex film
15: crystalline substrate having a concave-convex structure
16: projection area of the concave part of the support film
17: center line of the projection area of the concave part of the support film
18: resist film
19: cross section of the concave-convex film
20: width of the convex part of the concave-convex film of the transfer film
21: height of the convex part of the concave-convex film of the transfer film
22: width of the convex part of the concave-convex film of the crystalline substrate having the concave-convex film
23: height of the convex part of the concave-convex film of the crystalline substrate having the concave-convex film

DETAILED DESCRIPTION

Next, the method of producing a crystalline substrate having a concave-convex structure is described in further detail by referring to the drawings and the like.

The method of producing a crystalline substrate having a concave-convex structure comprises steps (A) to (C), and a concave-convex structure is thereby formed on the crystalline substrate.

Each step is briefly explained by referring the schematic cross sectional view of the transfer film and/or the crystalline substrate in each step shown in FIG. 1 and, then, each step is described in detail.

Step (A) is the step of forming the transfer film. In this step, a concave-convex film having a particular residual film thickness is formed on a support film having a particular concave-convex pattern on the surface (hereinafter also referred to as the support film) on the surface formed with the concave-convex pattern. FIG. 1-a schematically shows a support film 6 having a concave-convex film 10 formed on the surface of the support film 6 having the concave-convex pattern.

Step (B) is the transfer step wherein the transfer film is disposed on the crystalline substrate, and the concave-convex film as described above is transferred onto the crystalline substrate to produce a crystalline substrate having the concave-convex film thereon. FIG. 1-b schematically shows the support film 6 which has been peeled off to leave a crystalline substrate having the concave-convex film 14. In this figure, the concave-convex shape of the surface of the crystalline substrate shown by the numeral 13 receiving the concave-convex film 10 is exaggerated for the purpose of explanation. The figure, however, schematically shows the sapphire crystalline substrate (thickness, 50 to 1000 µm; TTV, 1 to 25 µm; LTV, 1 to 15 µm; warp, −25 to 25 µm) commonly used for the growth of the light-emitting layer of the light-emitting diode in which our method is used.

Step (C) is the etching step wherein the crystalline substrate having the concave-convex film thereon is etched to form a concave-convex structure on the surface of a crystalline substrate. FIG. 1-c schematically shows the crystalline substrate having a concave-convex structure 15 formed thereon.

Step (A): Step of Forming the Transfer Film

Figure 2:
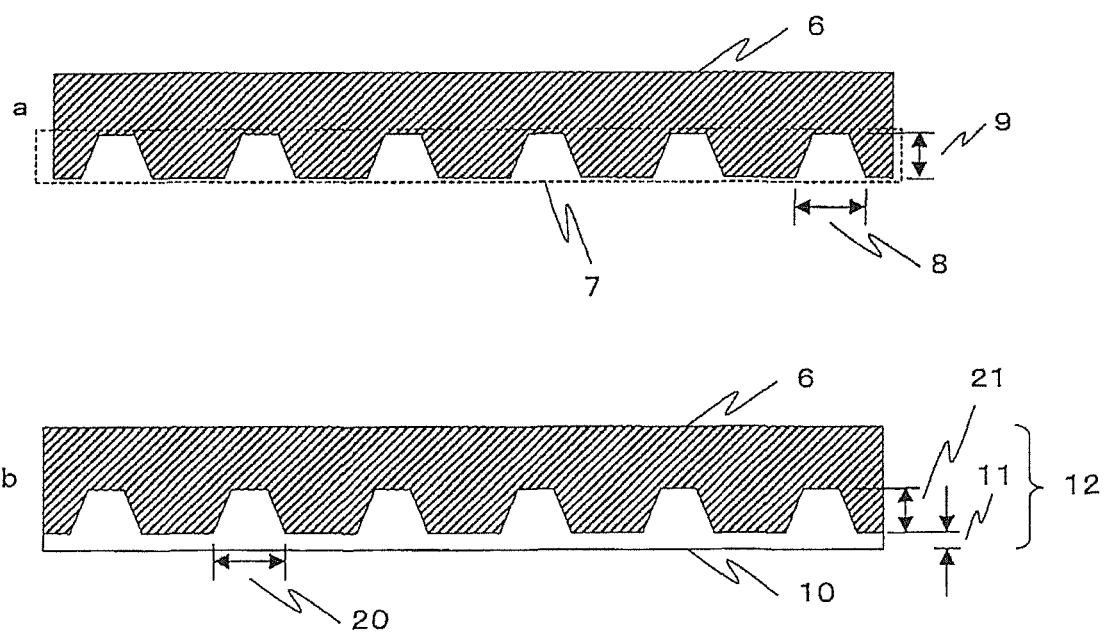
FIGS. 2-a and b shows schematic views for explaining the step of transfer film formation in the production method.

The step of forming the transfer film is described by referring FIG. 2. In this step of forming the transfer film, the concave-convex film 10 is formed on the support film 6 on the surface provided with the concave-convex pattern 7.

The support film 6 has the concave-convex pattern 7 on at least one surface thereof, and the concave-convex pattern 7 has the width w of the concave part of 0.05 to 100 µm, the depth d of the concave part of 0.05 to 10 µm, and the ratio d/w of the depth d of the concave part to the width w of the concave part (hereinafter also abbreviated as d/w) of up to 1.5. Preferably, the width w of the concave part is 0.1 to 5 µm, the depth d of the concave part of 0.1 to 3 µm, and the d/w of up to 1.2. When the width of the concave part of the support film 6 is less than 0.05 µm, control of the dimensional precision is difficult due to the expansion of the resin material constituting the support film 6 by moisture and heat, while the width of the concave part of the support film 6 in excess of 100 µm results in the difficulty of releasing the concave-convex film 10 in the transfer onto the crystalline substrate. The width w of the concave part of the support film 6 of 0.05 to 100 µm means that the average of the width of the concave parts of the support film 6 is in the range of 0.05 to 100 µm. When the depth d of the concave part of the support film 6 is less than 0.05 µm, etching of the concave-convex structure on the surface of the crystalline substrate to the desired height becomes difficult. On the other hand, depth d of the concave part of the support film 6 in excess of 10 µm results in the cracks in the concave-convex film and etching of the concave-convex structure on the surface of the crystalline substrate to the desired dimension becomes difficult. The depth d of the concave part of the support film 6 of 0.05 to 10 µm means that the average of the depth of the concave part of the support film 6 is in the range of 0.05 to 10 µm.

When the ratio d/w of the depth d of the concave part to the width w of the concave part of the support film is in excess of 1.5, transfer of the concave-convex film 10 to the crystalline substrate in the transfer step becomes difficult. The ratio d/w of up to 1.5 means that the value obtained by dividing the depth d of the concave part of the support film 6 (average of the concave parts) by the width w of the concave part of the support film 6 (average of the concave parts) is in the range of up to 1.5.

Next, the definition and the method of determining the width w of the concave part, the depth d of the concave part, and the ratio d/w of the depth d of the concave part to the width w of the concave part are described. Individual values determined to calculate the w and the d are designated $w_0$ and $d_0$.

FIG. 2-a shows the cross section including the concave parts of the support film 6 having the concave-convex pattern on its surface. In FIG. 2-a, the width $w_0$ of the concave part is the width of the opening of the concave part, namely, the distance represented by the numeral 8 in FIG. 2a. The depth $d_0$ of the concave part is the depth from the opening to the bottom of the concave part, namely, the distance represented by the numeral 9 in FIG. 2a.

Figure 5:
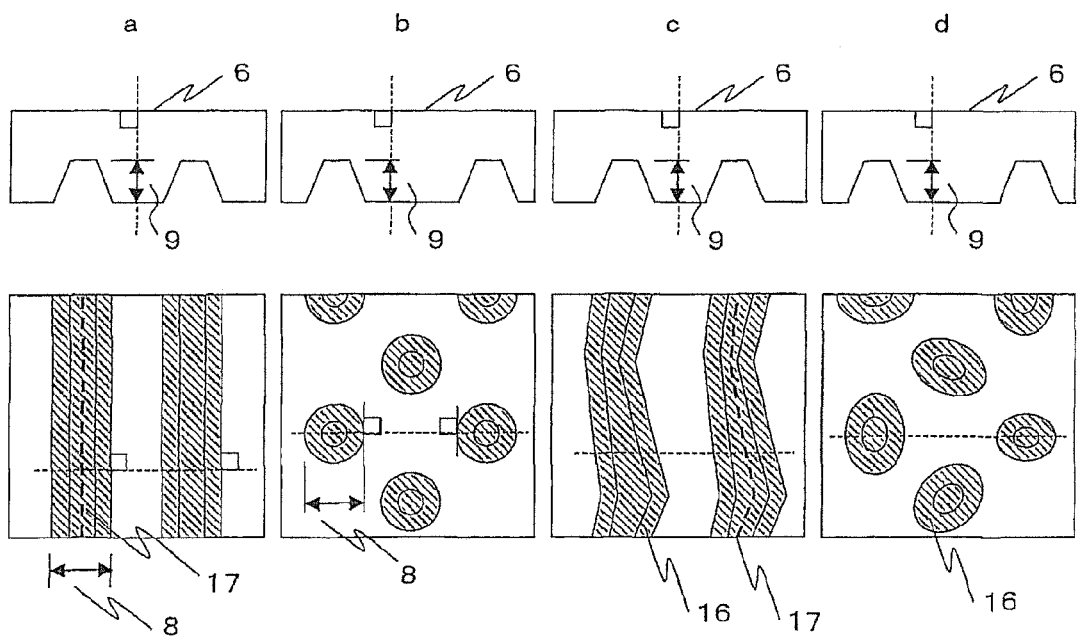
FIGS. 5-a, b, c and d shows schematic views showing the position and the direction selected for the measuring width of the concave part and depth of the concave part in the evaluation of the concave-convex pattern of the support film having the concave-convex pattern.

FIG. 2-a is the view explaining the typical measurement of the width $w_0$ of the concave part and the depth $d_0$ of the concave part. The measurement of the concave-convex pattern as described above in the actual system is explained particularly for the positions of the measurement by referring to FIG. 5. In FIG. 5, plan views are shown in the lower row, and cross sections taken along the broken line in the plan view are shown in the upper row.

(1) Width w of the Concave Part of the Support Film (1-1) The width $w_0$ of the concave part of the support film is identified as described below by seeing the surface having the concave parts from normal direction on the bases of the contour of the concave part which is projected onto the plane parallel to the other surface of the support film.

(i) When the Concave Parts are Arranged in Lines (FIG. 5-a and FIG. 5-c)

When the concave parts are in the shape of straight lines as shown in FIG. 5-a, the width $w_0$ of the concave part is measured in the direction perpendicular to the axial direction of the concave part, and this width $w_0$ is regarded as the width $w_0$ of each line-shaped concave part.

When the concave parts in line shape are in the shapes of a bent line as shown in FIG. 5-c or a curved line (not shown but based on the same idea), the projection area 16 shown as a hatched area for each concave part in line shape is divided by the length of the center line 17 of the concave part projection, and this value is regarded as the width $w_0$ of the concave part in line shape. It is to be noted that the width $w_0$ of the concave part may be measured by this method also in the case of FIG. 5-a.

(ii) When the Concave Parts are Discretely Arranged (FIG. 5-b and FIG. 5-d)

When the concave part is true circle as show in FIG. 5-b, the diameter of the concave part is the width $w_0$ of the concave part.

When the concave part is an oval as shown in FIG. 5-d or a polygon (not shown but based on the same idea), the diameter of a circle having the same area as the area of the concave part shown by hatching is regarded as the width $w_0$ of the concave part.

(1-2) The average is the arithmetic average of the $w_0$ for 12 individual concave parts. Selection of the 12 concave parts used for calculating the average is conducted as described below.

(i) When the Concave Parts are Arranged in Lines (FIG. 5-a and FIG. 5-c)

An image is taken by a scanning electron microscope (hereinafter also abbreviated as SEM) so that 30 concave parts arranged in lines are in the field in the width direction. Every other 12 concave parts from the center of the image are selected.

(ii) When the Concave Parts are Discretely Arranged (FIG. 5-b and FIG. 5-d)

An image is taken by SEM so that 50 to 70 concave parts are in the field. The image is divided into 12 sections (4 sections in transverse direction and 3 sections in vertical direction), and the concave part nearest to the center of each section is selected for the measurement.

(2) Ratio d/w of the Depth d of the Concave Part of the Support Film to the Width w of the Concave Part of the Support Film The depth d of the concave part (the average of the concave parts) is determined according to the following (2-1) and (2-2), and this depth d is divided by the width w of the concave part (the average of the concave parts) determined in the above (1).

(2-1) The depth d of the concave part of the support film is identified as described below.

(i) When the Concave Parts are Arranged in Lines (FIG. 5-*a* and FIG. 5-*c*)

For each concave part in line shape, 10 measuring positions are selected along the center line 17 of projection of the concave part such that each position are at least 5 μm apart, and the depth $d_0$ is measured at each position. The average is calculated, and this average is regarded as the depth $d_0$ of the concave part in line shape.

(ii) When the Concave Parts are Discretely Arranged (FIG. 5-*b* and FIG. 5-*d*)

For each concave part, the depth is measured at the deepest position, and this value is regarded as the depth $d_0$ of the concave part.

(2-2) The average is the arithmetic average of the $d_0$ of 12 individual concave parts. Selection of the 12 concave parts used for calculating the average is conducted as described below.

(i) When the Concave Parts are Arranged in Lines (FIG. 5-*a* and FIG. 5-*c*)

An image is taken by an atomic force microscope (hereinafter also abbreviated as AFM) so that 30 concave parts arranged in lines are in the field in the width direction. Every other 12 concave parts from the center of the image are selected.

(ii) When the Concave Parts are Discretely Arranged (FIG. 5-*b* and FIG. 5-*d*)

An image is taken by AFM so that 50 to 70 concave parts are in the field. The image is divided into 12 sections (4 sections in transverse direction and 3 sections in vertical direction), and the concave part nearest to the center of each section is selected for the measurement.

The method used to form the surface having the concave-convex pattern 7 of the support film 6 is not particularly limited, and exemplary methods include thermal imprinting, UV (ultraviolet) imprinting, etching, coating, and self-assembly.

Thickness of the support film 6 is preferably 5 to 400 μm, and more preferably 20 to 300 μm. When the thickness is less than 5 μm, the support film easily becomes twisted due to the low stiffness, and the handling may become difficult. When the thickness is in excess of 400 μm, the high stiffness results in the low followability to the convex and concave shapes and warp on the surface of the crystalline substrate, and difficulty in the handling. The thickness of the support film 6 is the volume average thickness, and this value is obtained by dividing the volume of the support film 6 by the area of the support film 6.

The material used for the support film 6 is not particularly limited as long as no adverse effect is caused on the solvent resistance and heat resistance in the process. Exemplary materials include resins such as polyesters such as polyethylene terephthalate, polyethylene-2,6-naphthalate, polypropylene terephthalate, polybuthylene terephthalate, cyclohexane dimethanol copolymerization polyester, isophthalic acid copolymerization polyester, spiroglycol copolymerized polyester, and fluorene copolymerized polyester; polyolefin resins such as polyethylene, polystyrene, polypropylene, polyisobutylene, polybutene, polymethyl pentene, and cyclic polyolefin copolymer; thermoplastic acrylic resins such as polymethacrylic acid resin, polymethyl methacrylate resin, and other polymethacrylate resin and those having substituents, and copolymers thereof with a cyclic structure such as glutaric anhydride, glutaric acid imide, and maleic anhydride and UV curable acrylic resins such as polyfunctional (meth)acryl compound, vinyl compound, (meth)acrylate compound, allyl compound, and metal salt of (meth)acrylic acid (the thermoplastic acrylic resin and the UV curable acrylic resin being together referred to as the acrylic resin); polyurethane, polycarbonate, high impact polystyrene, styrene-acrylonitrile copolymer, methyl methacrylate-styrene copolymer, methyl methacrylate-butadiene-styrene copolymer, styrene-maleic anhydride copolymer, styrene-methacrylic acid copolymer, and other heat resistant styrenes prepared by copolymerizing α-methylstyrene or maleimide; and styrene-acrylonitrile copolymer, α-methylstyrene-acrylonitrile copolymer, polyphenylene ether, polyamide, polyimide, polyether, polyester amide, polyether ester, polyvinyl chloride, and copolymers and mixtures containing these as their component.

Of these, the surface of the support film 6 having the concave-convex pattern 7 is preferably formed by using a material containing a polyolefin resin or an acrylic resin as its main component in view of simultaneously realizing the coating ability of the coating solution in forming the concave-convex film in the step of forming the transfer film and releasability in the subsequent transfer step. The "main component" is the component at a content of at least 50% by mass, preferably at least 60% by mass, and more preferably at least 80% by mass. Of the polyolefin resin, the preferred are the cyclic polyolefin copolymers, and the preferable acrylic resins are the UV curable acrylic resin. In addition, coating of an undercoat adjuster material, undercoating agent, or silicone and fluorine mold release coating agent or a thin film of a noble metal such as gold or platinum may be provided to further adjust the coating properties and the releasability.

The surface free energy on the surface of the support film 6 having the concave-convex pattern 7 is preferably 23 to 70 mN/m, more preferably 25 to 60 mN/m, and most preferably 40 to 50 N/m. When the surface free energy is less than 23 mN/m, cissing may be generated in the coating of the coating solution during the formation of the concave-convex film 10, and the surface free energy in excess of 70 mN/m may result in the difficulty of transferring the concave-convex film 10 onto the crystalline substrate in the transfer step.

The surface free energy of the support film is the value obtained by substituting the values of each component and the value of the contact angle of the surface whose surface free energy is to be calculated for 4 types of liquids having known surface free energy and components thereof (dispersion force, polar force, and hydrogen bond components) in the Formula (1) derived from extended Fowkes's equation and Young's equation; solving the simultaneous equation; and calculating the sum of all components of the surface measured.

$$(\gamma_S^d \cdot \gamma_L^d)^{1/2} + (\gamma_S^p \cdot \gamma_L^p)^{1/2} + (\gamma_S^h \cdot \gamma_L^h)^{1/2} = (1+\cos\theta)/2 \quad (1)$$

$\gamma_L^d$, $\gamma_L^p$, and $\gamma_L^h$ are respectively the values (known) of the dispersion force component, the polar force component, the hydrogen bond component of the liquid measured, θ is the contact angle of the liquid measured on the surface measured, and $\gamma_S^d$, $\gamma_S^p$, and $\gamma_S^h$ are respectively the values of the dispersion force component, the polar force component, and the hydrogen bond component on the film surface. The four types of liquids having known surface free energy and components thereof used are pure water, ethylene glycol, formamide, and methylene iodide. The values shown in Table 1 are used for the values of the components.

It is to be noted that the values of each component of the surface free energy are the values having the influence of the measurement environment on the surface free energy removed therefrom by using the standard samples with known values of each component. More specifically, the surface free energy is calculated for both of the measurement sample and the standard samples by using the contact angle and the measurement data to obtain the actual data (provisional data) of these samples, and the actual data (provisional value) of the measurement sample are corrected by the difference between the actual data (provision value) of the standard sample and the standard value to compensate for the influence of the measurement environment on the surface free energy. The procedure actually used is described in the Examples.

In the step of forming the transfer film, the concave-convex film is formed on the surface of the support film 6 having the concave-convex pattern formed thereon so that the concave-convex film has the residual film thickness as described below. FIG. 2-b shows the state wherein the concave-convex film 10 has been formed on the surface of the support film 6 having the concave-convex pattern formed thereon. The method used to form the concave-convex film 10 on the surface of the support film 6 having the concave-convex pattern formed thereon is preferably the method wherein the coating solution containing the material of the concave-convex film 10 is coated and dried in view of the ease of controlling the thickness of the concave-convex film 10.

The concave-convex film 10 preferably comprises (i) a material containing a novolac resin or a polyimide as its resin component, or (ii) a material containing a siloxane oligomer wherein the ratio of the number of silicon atoms to the total number of carbon, oxygen, and silicon atoms measured by X-ray photoelectron spectroscopy (XPS) is 5 to 33 atom %.

When the concave-convex film 10 comprises (i) a material containing a novolac resin or a polyimide as its resin component, heat resistance is ensured in the etching step and a resist mask having excellent etching rate and selection ratio can be realized, and therefore, use of the material (i) is preferable. The "main component" as used herein is the component at a content of at least 50% by mass, preferably at least 60% by mass, and more preferably at least 80% by mass.

The novolac resin which is used as a preferable material (i) for the material of the concave-convex film 10 is a general designation of the resin prepared by the polycondensation by a known method using a phenol compound and an aldehyde compound for the starting material. Exemplary phenol compounds other than phenol which are preferable as a starting material for the concave-convex film 10 include cresol compounds such as p-cresol, m-cresol, and o-cresol, xylenol compounds such as 2,3-xylenol, 2,4-xylenol, 2,5-xylenol, 2,6-xylenol, 3,4-xylenol, and 3,5-xylenol, trimethylphenol compounds such as 2,3,4-trimethylphenol, 2,3,5-trimethylphenol, 3,4,5-trimethylphenol, and 2,4,5-trimethylphenol, ethylphenol compounds such as o-ethylphenol, m-ethylphenol, and p-ethylphenol, diethyl phenol compounds such as 2,3-diethylphenol and 2,5-diethyl phenol, and alkylphenol compounds such as isopropylphenol, butylphenol, and p-tert-butylphenol; and also, bisphenol compounds such as methylene bisphenol and methylene bis-p-cresol, polyhydric phenol compounds such as resorcin, 2-methylresorcin, 4-methylresorcin, catechol, hydroquinone, pyrogallol, and phloroglucinol, halogen-substituted phenol compound such as o-chlorophenol, m-chlorophenol, p-chlorophenol, and 2,3-dichlorophenol, alkoxy-substituted phenol compound such as m-methoxyphenol, p-methoxyphenol, and p-butoxyphenol, and naphthol compounds such as α-naphthol and β-naphthol, which may be used alone or in combination of two or more.

Examples of the aldehyde compound which is used as a preferable starting material of the concave-convex film 10 include formaldehyde (formalin), paraformaldehyde, acetaldehyde, benzaldehyde, hydroxybenzaldehyde, chloroacetaldehyde, and salicylaldehyde. Of these, the most preferred is formalin. These aldehyde compounds may be used alone or in combination of two or more. This aldehyde compound may be used at an amount of 0.6 to 3 moles, and more preferably 0.7 to 1.5 moles per mole of the phenol compound.

The polycondensation of the phenol compound and the aldehyde compound is typically accomplished by the use of an acid catalyst. Exemplary such acid catalysts include hydrochloric acid, nitric acid, sulfuric acid, formic acid, oxalic acid, acetic acid, and p-toluenesulfonic acid. Of these, the preferred is use of oxalic acid in view of the ease of removal from the phenol resin since oxalic acid is decomposed and becomes a gas when heated to a high temperature.

In the polycondensation reaction, use of a reaction medium is preferable, and the reaction medium typically used is water. However, when the system is nonhomogeneous system from the initial stage of the reaction, the reaction medium used is hydrophilic solvent or lipophilic solvent. Examples of the hydrophilic solvent include alcohol compounds such as methanol, ethanol, propanol, butanol, and propylene glycol monomethyl ether, and cyclic ether compounds such as tetrahydrofuran and dioxane. Examples of the lipophilic solvent include ketone compounds such as methyl ethyl ketone, methyl isobutyl ketone, and 2-heptanone.

If desired, an acrylic resin may be incorporated to improve the filling of the support film 6 in the concave-convex pattern 7 to thereby realize a more minute pattern of the concave-convex film 10. Exemplary acrylic resins include acrylic resin obtained by polymerizing hydroxy styrene, acrylic acid, methacrylic acid, maleic acid, or a derivative thereof which is a monomer having an alkali-soluble group; and also, those prepared by copolymerizing a monomer having an alkali-soluble group with an alkali-nonsoluble acrylate, methacrylate, maleic acid ester, hydroxy styrene ester, styrene, vinyl alcohol, vinyl acetate, vinyl ester, and derivatives thereof with the alkali-solubility maintained. More particularly, the preferred is use for the alkali-soluble resin of a polyhydroxystyrene, for example, the one prepared by polymerizing a hydroxy styrene compound such as o-hydroxystyrene, m-hydroxystyrene, p-hydroxy styrene, 2-(o-hydroxyphenyl)propylene, 2-(m-hydroxyphenyl)propylene, or 2-(p-hydroxyphenyl)propylene used alone or in combination of two or more in the presence of a radical polymerization initiator, anionic polymerization initiator, or cationic polymerization initiator. The acrylic resin is preferably used at an amount such that the acrylic resin is present at 5 to 40 parts by mass in relation to the total amount of the resin of the concave-convex film 10. When the content is less than 5 parts by mass, filling of the support film 6 to the concave-convex pattern 7 is not improved and the desired minute concave-convex pattern may not be obtained. When the content is in excess of 40 parts by mass, heat resistance of the concave-convex film 10 in the etching step may not be realized, and the concave-convex structure may not be formed on the crystalline substrate.

In addition, a surfactant, an ester compound such as ethyl lactate or propylene glycol monomethyl ether acetate, an alcohol compound such as ethanol, a ketone compound such as cyclohexanone or methyl isobutyl ketone, or an ether compound such as tetrahydrofuran or dioxane may also be added for the purpose of improving the wettability with the support film 6. If desired, inorganic particles such as silicon dioxide or titanium dioxide or powder of polyimide may also be added.

In addition, inorganic particles may be added for the purpose of suppressing deformation of the concave-convex film 10 in the heat treatment. Preferable non-limiting examples include silicon oxide, titanium oxide, barium titanate, alumina, and talc, and these inorganic particles may have a primary particle size of up to 100 nm, and more preferably up to 60 nm. When the primary particle size of the inorganic particles is in excess of 100 nm, filling of the support film 6 to the concave-convex pattern 7 will be difficult to detract from the formation of the concave-convex film 10.

Furthermore, a silane compound may be added to improve the adhesion with the crystalline substrate. Exemplary non-limiting silane compounds include N-phenylaminoethyltrimethoxysilane, N-phenylaminoethyltriethoxysilane, N-phenylaminopropyltrimethoxysilane, N-phenylaminopropyltriethoxysilane, N-phenylaminobutyltrimethoxysilane, N-phenylaminobutyltriethoxysilane, vinyltrimethoxysilane, vinyltriethoxysilane, vinyltrichlorosilane, vinyltris(β-methoxyethoxy)silane, 3-methacryloxypropyltrimethoxysilane, 3-acryloxypropyltrimethoxysilane, 3-mercaptopropylmethyldimethoxysilane, 3-mercaptopropyltrimethoxysilane, 3-methacryloxypropylmethyldimethoxysilane, 3-methacryloxypropylmethyldiethoxysilane, 2-(3,4-epoxycyclohexyl)ethyltrimethoxysilane, 3-glycidoxypropyltrimethoxysilane, 3-glycidoxypropylmethyl diethoxysilane, 3-glycidoxypropyltriethoxysilane, 3-ethyl-[(triethoxysilylpropoxy)methyl]oxetane, p-trimethoxysilylaniline, m-trimethoxysilylaniline, p-trimethoxysilyl acetanilide, and m-trimethoxysilyl acetanilide. Content of the silane compound is preferably at least 1 parts by mass, and more preferably at least 2 parts by mass in relation to 100 parts by mass of the novolac phenol resin. In view of the mechanical characteristics of the film after the thermal curing, the content is preferably up to 30 parts by mass, and more preferably up to 15 parts by mass. When the content is less than 1 part by weight, the effect of improving the adhesion may not be realized, and the content in excess of 30 parts by weight may result in the loss of the wettability to support film 6 and, hence, in the failure of forming the concave-convex film 10.

The polyimide resin which is used as a preferable material (i) for the material of the concave-convex film 10 is a resin having a cyclic structure such as imide ring, oxazole ring, imidazole ring, thiazole ring, or the like in the backbone and/or its precursor. More specifically, the polyimide resin is a mixture of at least one member selected from the group consisting of polyimide, polybenzoxazole, polyamideimide, polybenzimidazole, and polybenzothiazole, a precursor of any one member selected from such group, or a copolymer thereof. Examples of the precursor of such polyimide resin include polyamic acid, polyamic acid ester, polyamic acid amide, and polyisoimide. The polyamic acid, for example, may be prepared by reacting a tetracarboxylic acid or corresponding tetracarboxylic acid dianhydride, tetracarboxylic acid diester dichloride, or the like with a diamine or corresponding diisocyanate compound, trimethylsilylated diamine, or the like. The polyimide can be obtained by cyclodehydration of the polyamic acid prepared by the method as described above by heating or chemical treatment with acid or base. An exemplary polybenzoxazole precursor is polyhydroxyamide. The polyhydroxyamide, for example, may be prepared by reacting bisaminophenol with dicarboxylic acid, corresponding dicarboxylic acid chloride, dicarboxylic acid active ester, or the like. The polybenzoxazole, for example, may be prepared by cyclodehydration of the polyhydroxyamide prepared by the method as described above by heating or chemical treatment with phosphoric anhydride, base, carbodiimide compound, or the like. The polyamide imide precursor, for example, may be prepared by reacting a tricarboxylic acid, corresponding tricarboxylic acid anhydride, tricarboxylic acid anhydride halide, or the like with a diamine or a diisocyanate. A polyamide imide, for example, may be prepared by cyclodehydration of the precursor prepared by the method as described above by heating or chemical treatment with an acid or a base.

If desired, an aliphatic group having siloxane structure may be copolymerized to the extent not adversely affecting the heat resistance to thereby improve the adhesion with the crystalline substrate. Examples include those prepared by copolymerizing 1 to 10% by mole of a diamine component such as bis(3-aminopropyl)tetramethyldisiloxane, bis(p-aminophenyl)octamethylpentasiloxane, or the like.

To improve the storage stability of the resin composition, the terminal of the backbone may be capped with a terminal blocking agent such as monoamine, acid anhydride, monocarboxylic acid, monoacid chloride compound, or monoactive ester compound. When a monoamine is used for the terminal blocking agent, it is preferably incorporated at an amount of at least 0.1% by mole, more preferably at least 5% by mole, still more preferably up to 60% by mole, and most preferably up to 50% by mole in relation to the entire amine component. When an acid anhydride, monocarboxylic acid, monoacid chloride compound, or monoactive ester compound is used for the terminal blocking agent, it is preferably incorporated at an amount of at least 0.1% by mole, and more preferably at least 5% by mole, and preferably at an amount of up to 100% by mole, and more preferably up to 90% by mole in relation to the diamine component. It is also possible to use a plurality of terminal blocking agents to thereby introduce a plurality of different terminal groups. Exemplary preferable monoamines include aniline, 2-ethynylaniline, 3-ethynylaniline, 4-ethynylaniline, 5-amino-8-hydroxy quinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxy pyrimidine, 2-aminophenol, 3-aminophenol, 4-aminophenol, 2-aminothiophenol, 3-aminothiophenol, and 4-aminothiophenol, which may be used in combination of two or more. Exemplary preferable acid anhydrides, monocarboxylic acids, monoacid chloride compounds, and monoactive ester compounds include acid anhydrides such as phthalic anhydride, maleic anhydride, nadic anhydride, cyclohexanedicarboxylic anhydride, and 3-hydroxyphthalic anhydride; monocarboxylic acid compounds such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxy benzenesulfonic acid, and 4-carboxybenzenesulfonic acid; monoacid chloride compounds wherein carboxyl group of such compound has become the acid chloride; monoacid chloride compounds wherein one carboxyl group of a dicarboxylic acid compound such as terephthalic acid, phthalic acid, maleic acid, cyclohexane dicarboxylic acid, 1,5-dicarboxynaphthalene, 1,6-dicarboxynaphthalene, 1,7-dicarboxynaphthalene, or 2,6-dicarboxynaphthalene has become the acid chloride; active ester compounds prepared by the reaction between the monoacid chloride compound and N-hydroxybenzotriazole or N-hydroxy-5-norbornene-2,3-dicarboxylmide; which may be used in combination of two or more.

If desired, a surfactant, an ester compound such as ethyl lactate or propylene glycol monomethyl ether acetate, an alcohol compound such as ethanol, a ketone compound such as cyclohexanone or methyl isobutyl ketone, or a cyclic ether compound such as tetrahydrofuran or dioxane may be incorporated for the purpose of improving the wettability with the support film 6.

If desired, inorganic particles may also be incorporated for the purpose of suppressing the deformation of the concave-convex film 10 by the heat treatment. Exemplary non-limiting preferable inorganic particles include silicon oxide, titanium oxide, barium titanate, alumina, and talc. The primary particle size of the inorganic particles is preferably up to 100 nm, and more preferably up to 60 nm. When the primary particle size of the inorganic particles is in excess of 100 nm, filling of the support film 6 to the concave-convex pattern 7 will be difficult to detract from the formation of the concave-convex film 10.

Furthermore, a silane coupling agent such as trimethoxyaminopropylsilane, trimethoxyepoxysilane, trimethoxyvinylsilane, or trimethoxythiolpropylsilane may be added as a silicon component to the resin composition to thereby improve the adhesion with the crystalline substrate, and such addition may be conducted to the extent not detracting from the storage stability. Preferable content is 0.01 to 5 parts by mass in relation to 100 parts by mass of the polyimide resin. When the content is less than 0.01 parts by mass, the effect of improving the adhesion may not be realized, while the content in excess of 5 parts by mass may result in the loss of wettability of the support film 6 and, hence, failure in the formation of the concave-convex film 10.

When the concave-convex film 10 comprises (ii) a material containing a siloxane oligomer wherein the ratio of the number of silicon atoms to the total number of carbon, oxygen, and silicon atoms measured by X-ray photoelectron spectroscopy (XPS) is 5 to 33 atom %, durability to the etching solution is ensured in the etching step and a resist mask having excellent etching rate and selection ratio can be realized, and therefore use of the material (ii) is preferable. In such a case, when the ratio of the number of silicon atoms is less than 5 atom %, the siloxane bond in the siloxane oligomer in the concave-convex film 10 will be insufficient, and the concave-convex film 10 will be etched by the etching solution in the etching step before the etching of the crystalline substrate, and the concave-convex structure may not be formed on the crystalline substrate. On the other hand, when the ratio of the silicon atom number is in excess of 33 atom %, the structure of the siloxane oligomer in the concave-convex film 10 will very much resemble glass, and the adhesion between the crystalline substrate of the concave-convex film 10 in the transfer step may be insufficient. In view of such situation, the ratio of the number of silicon atoms to the total number of carbon, oxygen, and silicon atoms measured by X-ray photoelectron spectroscopy (XPS) is preferably 8 to 32 atom %. In addition, the siloxane oligomer in the concave-convex film 10 is preferably 50 to 99% by mass. The "siloxane oligomer" as used herein is a siloxane compound which has at least 2 consecutive siloxane bonds and which has a polyorganosiloxane skeleton in the structure. The siloxane oligomer may partly contain a silica structure which does not have the organic functional group directly bonded to silicon atom as the partial structure. While the mass average molecular weight of the siloxane oligomer is not particularly limited, the mass average molecular weight in polystyrene basis measured by GPC is preferably 500 to 100,000. The siloxane oligomer is the one synthesized by preparing a siloxane sol by hydrolytic polycondensation of one or more of organosilanes represented by Formula (I), and curing the siloxane sol by applying heat and pressure:

$$(R1)_n\text{-Si}-(OR2)_{4-n} \quad (I)$$

wherein R1 independently represents any one of hydrogen, an alkyl group containing 1 to 10 carbon atoms, an alkenyl group containing 2 to 10 carbon atoms, and an aryl group containing 6 to 15 carbon atoms, R2 independently represents any one of hydrogen, an alkyl group containing 1 to 6 carbon atoms, an acyl group containing 1 to 6 carbon atoms, and an aryl group containing 6 to 15 carbon atoms, and n represents an integer of 0 to 3.

The siloxane oligomer is preferably the one obtained by hydrolytic polycondensation of monomers containing 5 to 100% by mole of an organosilane (n=1 to 3) in view of preventing the cracks in the concave-convex film 10 during the storage in the form of the transfer film and preventing the cracks in the heat treatment of the concave-convex film 10 transferred to the crystalline substrate in the transfer step.

In the organosilane represented by Formula (I), the alkyl group, the alkenyl group, or the aryl group of R1 may be either an unsubstituted group or a substituted group, and R1 may be selected depending on the properties of the composition. Exemplary such alkyl groups include methyl group, ethyl group, n-propyl group, isopropyl group, n-butyl group, t-butyl group, n-hexyl group, n-decyl group, trifluoromethyl group, 3,3,3-trifluoropropyl group, 3-glycidoxypropyl group, 2-(3,4-epoxycyclohexyl)ethyl group, [(3-ethyl 3-oxetanyl) methoxy]propyl group, 3-aminopropyl group, 3-mercaptopropyl group, and 3-isocyanate propyl group. Exemplary such alkenyl groups include vinyl group, 3-acryloxypropyl group, and 3-methacryloxypropyl group. Exemplary such aryl groups include phenyl group, tolyl group, p-hydroxyphenyl group, 1-(p-hydroxyphenyl)ethyl group, 2-(p-hydroxyphenyl)ethyl group, 4-hydroxy-5-(p-hydroxyphenylcarbonyloxy)pentyl group, and naphthyl group.

In the organosilane represented by Formula (I), the alkyl group, the acyl group, or the aryl group of R2 may be either an unsubstituted group or a substituted group selected depending on the properties of the composition. Exemplary such alkyl groups include methyl group, ethyl group, n-propyl group, isopropyl group, n-butyl group, n-pentyl group, and n-hexyl group, and exemplary such acyl groups include acetyl group, propynoyl group, butyloyl group, pentanoyl group, and hexanoyl group. Exemplary such aryl groups include phenyl group, and naphthyl group.

The n in Formula (I) represents an integer of 0 to 3. The organosilane is a tetrafunctional silane when n is 0, a trifunctional silane when n is 1, a difunctional silane when n is 2, and a monofunctional silane when n is 3.

Examples of the organosilane represented by Formula (I) include tetrafunctional silanes such as tetramethoxysilane, tetraethoxysilane, tetraacetoxysilane, and tetra phenoxysilane; trifunctional silanes such as methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, phenyltrimethoxysilane, phenyltriethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, and 3-mercaptopropyltriethoxysilane; difunctional silanes such as dimethyldimethoxysilane, dimethyldiethoxysilane, dimethyldiacetoxysilane, di-n-butyldimethoxysilane, and diphenyldimethoxysilane; and monofunctional silanes such as trimethylmethoxysilane and tri-n-butyl ethoxysilane.

These organosilanes may be used alone or in combination of two or more. However, a combination of trifunctional silane and difunctional silane is preferable in view of preventing cracks in the concave-convex film after the curing and softness of the transfer film. If desired, silica particles may be added in the concave-convex film for the purpose of improving the scratch resistance and hardness.

The coating solution for use in the formation of the concave-convex film 10 may also contain a leveling agent for improving the coating property in the coating of the coating solution onto the support film in the step of forming the transfer film, a release agent for improving the releasability from the support film 6 in the transfer step, a silane coupling agent to improve adhesion with the crystalline substrate in the transfer step, an acrylic resin to improve crack resistance in the heat treatment of the transfer step, and particles or fillers to improve the selection step in the etching step. Incorporation of these agents in the coating solution is preferable since such inclusion enables addition of these agents in the resulting concave-convex film 10.

The solvent used for the coating solution is not particularly limited as long as it has a solubility required to obtain a solution having a concentration adequate for use in the coating. The solvent, however, is preferably an organic solvent in view of the lower probability of cissing by the film. Exemplary solvents include high boiling point alcohol compounds such as 3-methyl-3-methoxy-1-butanol; glycol compounds such as ethylene glycol and propylene glycol; ether compounds such as ethylene glycol monomethyl ether, ethylene glycol monomethyl ether acetate, propylene glycol monomethyl ether, propylene glycol monoethyl ether, propylene glycol monomethyl ether acetate, propylene glycol monoethyl ether, propylene glycol monopropyl ether, propylene glycol monobutyl ether, diethyl ether, diisopropyl ether, di-n-butyl ether, diphenyl ether, diethylene glycol dimethyl ether, diethylene glycol diethyl ether, diethylene glycol ethyl methyl ether, and dipropylene glycol dimethyl ether; ketone compounds such as methyl isobutyl ketone, diisopropyl ketone, diisobutyl ketone, cyclopentanone, cyclohexanone, 2-heptanone, and 3-heptanone; amide compounds such as dimethylformamide and dimethyl acetamide; ester compounds such as ethyl acetate, butyl acetate, ethyl cellosolve acetate, and 3-methyl-3-methoxy-1-butanol acetate; aromatic or aliphatic hydrocarbons such as toluene, xylene, hexane, cyclohexane, mesitylene, and diisopropylbenzene; and γ-butyrolactone, N-methyl-2-pyrrolidone, and dimethyl sulfoxide. However, in view of the ability of dissolving the resin used for the concave-convex film 10 and the coating property on the support film, the preferred are propylene glycol monomethyl ether, propylene glycol monoethyl ether, propylene glycol monomethyl ether acetate, propylene glycol monoethyl ether, diisobutyl ether, di-n-butyl ether, diethylene glycol dimethyl ether, diethylene glycol diethyl ether, diethylene glycol ethyl methyl ether, dipropylene glycol dimethyl ether, methyl isobutyl ketone, diisobutyl ketone, and butyl acetate.

The method used to apply the coating solution on the surface of the support film 6 having the concave-convex pattern is not particularly limited, and exemplary coating methods include gravure coating, roll coating, spin coating, reverse coating, bar coating, die coating, screen coating, blade coating, air knife coating, and dip coating.

The method used for drying after the coating for the purpose of forming the concave-convex film 10 is not particularly limited, and exemplary methods include drying by heating and drying at a reduced pressure. In the case of the drying by heating, the drying is preferably conducted at a temperature of at least 20° C. and up to 180° C. The temperature lower than 20° C. may result in the longer drying period and, hence, in the reduced productivity, while the temperature in excess of 180° C. may invite difficulty in the release of the concave-convex film 10 in the transfer of the concave-convex film 10 onto the crystalline substrate. In the case of the drying at a reduced pressure, the pressure is preferably reduced to the range of up to 10 kPa. The pressure in excess of 10 kPa may result in the longer drying period and, hence, in the reduced productivity. The drying may also be accomplished by combining the drying by heating and the drying at a reduced pressure.

The concave-convex pattern of the thus formed concave-convex film 10 is substantially the reverse of the concave-convex pattern of the support film 6. More specifically, the width of the concave part of the concave-convex film 10 corresponds to the width of the convex part of the support film 6, and the height of the convex part of the concave-convex film 10 corresponds to the depth of the concave part of the support film 6. The preferable width range of the convex part of the concave-convex film 10 is the same as the range of the w which is the width 8 of the concave part of the support film 6. The preferable range of the ratio of the height of the convex part to the width of the concave part of the concave-convex film 10 is the same as the range of the ratio d/w of d which is the depth 9 of the concave part to the w which is the width 8 of the concave part of the support film 6. FIG. 2b shows the cross section of the transfer film 12 having the concave-convex film 10 formed on the surface of the support film 6 having the concave-convex pattern. As shown in this figure, the width of the concave part of the concave-convex film is the width of the skirt of the convex part, namely, the distance represented by the numeral 20 in FIG. 2b, and the height of the convex part is distance from the top of the convex part to the bottom of the convex part, namely, the part represented by the numeral 21 in FIG. 2b.

In the step of forming the transfer film in the production method, the concave-convex film is formed so that the residual film thickness h of the concave-convex film 10 after the drying is 0.01 to 1 µm. When the residual film thickness h of the concave-convex film 10 after the drying is less than 0.01 µm, the transfer of the concave-convex film 10 from the transfer film 12 to the crystalline substrate will be impaired, while the residual film thickness h in excess of 1 µm may result in the loss of productivity due to the longer period required for the etching of the residual film in the etching step. In view of the situation as described above, the concave-convex film is preferably formed so that the residual film thickness h of the concave-convex film 10 after the drying is 0.011 to 0.5 µm. The residual film thickness of 0.01 to 1 µm means that the average of the residual film thickness of the concave-convex film 10 after the drying (the measurement method is as described below) is 0.01 to 1 μm.

In the step of forming the transfer film of the production method, the concave-convex film is preferably formed so that the ratio d/h of the depth of the concave part (d) 9 of the support film 6 to the residual film thickness h of the concave-convex film 10 after the drying (hereinafter also abbreviated as d/h) is at least 0.5, and more preferably so that the d/h is at least 0.8. When the d/h is less than 0.5, the concave-convex film becomes flat in the step of removing the residual film of the concave-convex film 10 in the etching step, and this may result in the failure of forming the concave-convex structure on the crystalline substrate. The d/h of at least 0.5 means that the ratio d/h of the depth d of the concave part of the support film 6 (average of the concave parts) to the residual film thickness h of the concave-convex film 10 after the drying (average of the residual film thickness) is at least 0.5.

Figure 7:
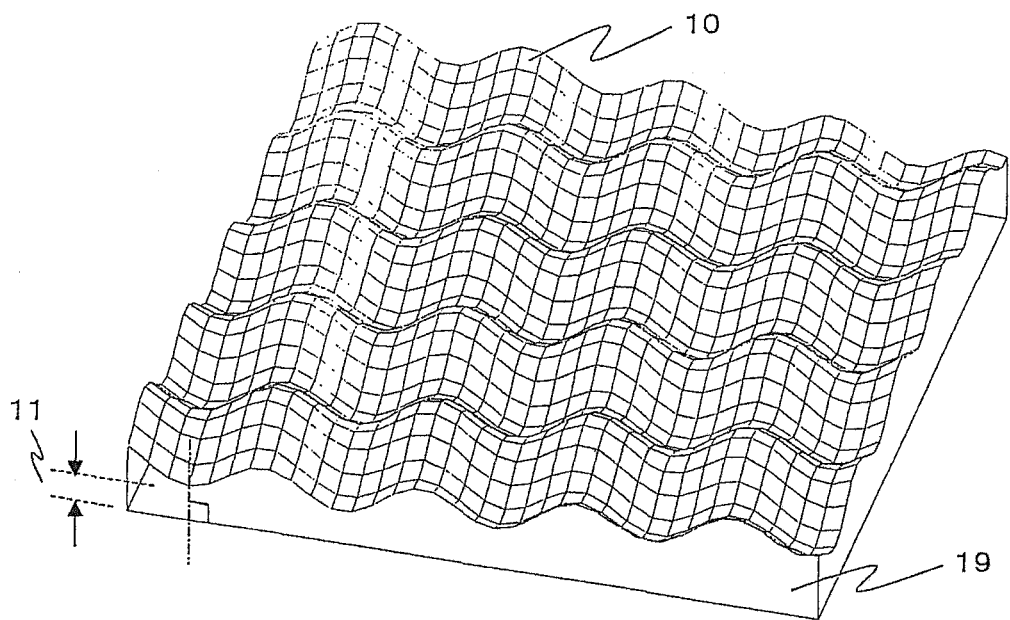
FIG. 7 is a schematic view showing the cross section of the position and the direction selected for measuring the residual film thickness in the evaluation of the residual film thickness of the concave-convex film.
Figure 8:
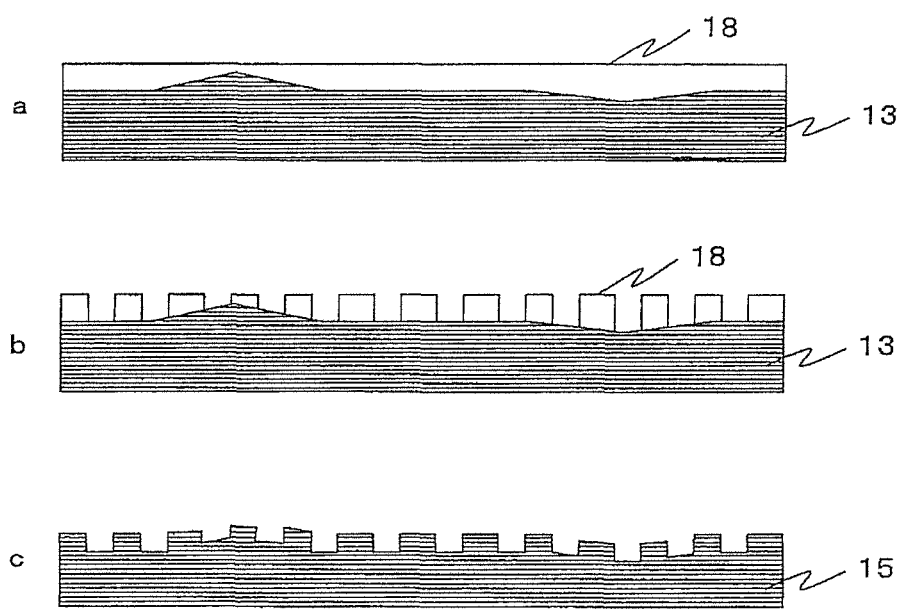
FIGS. 8-a, b and c shows schematic views showing the cross section of the resist and/or the crystalline substrate in each step of the lithography technique in a prior art production method.
Figure 9:
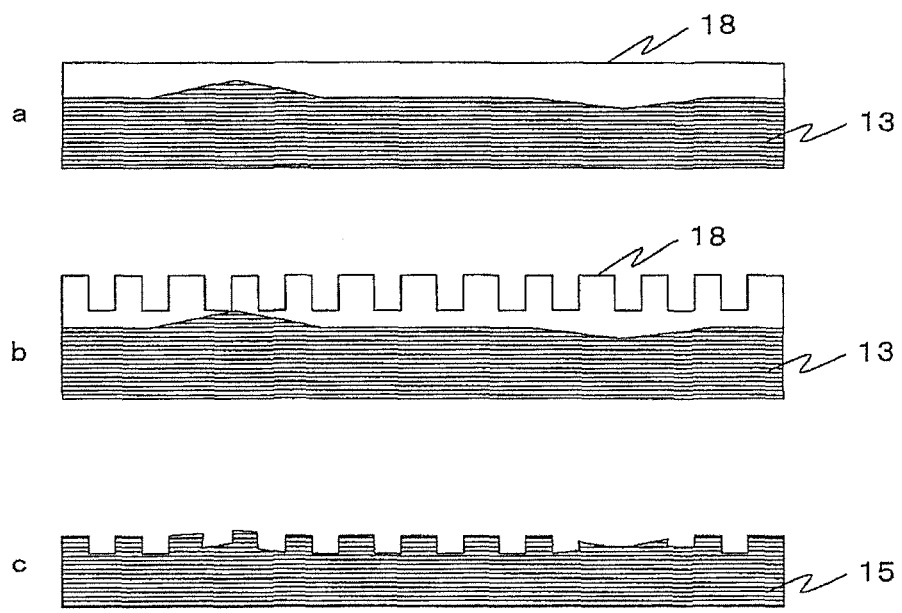
FIGS. 9-a, b and c shows schematic views showing the cross section of the resist and/or the crystalline substrate in each step of the imprinting technique in a prior art production method.

Next, the definition and the method of determining the residual film thickness h are explained. It is to be noted that, in this explanation, the individual value at each position of the measurement for determining the residual film thickness h (average) is indicated a residual film thickness $h_0$ as in the case of the width w of the concave part of the support film and the depth d of the concave part of the support film. The residual film thickness $h_0$ is the thickness between the bottom of the concave part on the surface of the concave-convex film 10 on the side of the support film 6 and the surface of the concave-convex film 10 on the side opposite to the support film 6 in each concave part of the concave-convex film 10, namely, the thickness represented by the numeral 11 in FIG. 2b, and this distance can be measured from the image taken by SEM. In the actually measured sample, for example, the one having the concave-convex shape as shown in FIG. 7, it is not easy to obtain a cross section including the bottom of the concave part suitable for measuring the residual film thickness $h_0$. Accordingly, a sample is prepared so that the cross section includes 50 or more concave-convex shapes, and the thinnest concave part is regarded the residual film thickness $h_0$ of the cross section, and the average of 10 such residual film thickness obtained by measuring 10 samples in each level is regarded the residual film thickness h of the level.

The residual film thickness h of the concave-convex film 10 can be adjusted by changing concentration and/or coating thickness of the coating solution. For ease of adjusting the residual film thickness h, the coating solution may preferably have a solid concentration of 0.1% by mass to 20% by mass. When the solid concentration is less than 0.1% by mass, the residual film will not be formed, and this may lead to the failure of transfer in the transfer step. When the solid concentration is in excess of 20% by mass, the concave-convex film 10 may have an unduly high residual film thickness h.

The evenness of the residual film thickness of the concave-convex film 10 after the drying is preferably up to 25%, and more preferably up to 15%. The evenness of the residual film thickness is the value obtained by dividing the difference between the maximum residual film thickness and the minimum residual film thickness in each concave part of the concave-convex film 10 by the residual film thickness (average) of the concave-convex film 10, and representing the value in percentage. The evenness of the residual film thickness in excess of 25% may result in the uneven dimension of the concave-convex structure when the concave-convex structure is formed on the surface of the crystalline substrate by etching.

The evenness of the residual film thickness of the concave-convex film 10 can be adjusted by ensuring surface precision of the upper surface of the convex part (ensuring that the upper surface of the convex parts are in the same plane) on the surface of the support film having the concave-convex pattern and by controlling the surface evenness of the coating when the coating solution is coated for the purpose of the concave-convex film formation. The surface precision of the upper surface of the convex part on the surface of the support film having the concave-convex pattern depends on the precision of the mold used for providing the concave-convex pattern of the support, and this is generally not the problem, and it is the ensuring of the surface evenness of the coating after the coating of the coating solution that is more important. In view of such situation, the coating solution preferably has a viscosity of 1 mPa·s to 100 mPa·s. The viscosity of the coating solution of less than 1 mPa·s may result in the failure of the residual film formation and, hence, in the failure of the film transfer in the transfer step. The viscosity in excess of 100 mPa·s may result in the warp of the concave-convex film 10 on the side not in contact with the support film 6 and, hence, in the loss of the evenness of the residual film thickness.

Step (B): Transfer Step

Figure 3:
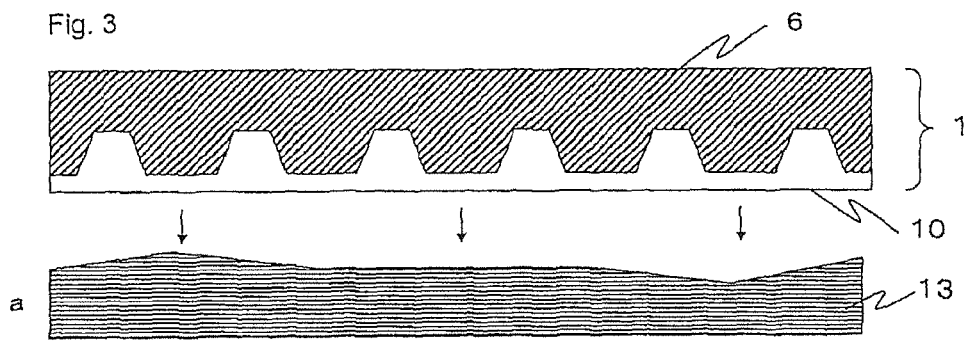
FIGS. 3-a and b shows schematic views for explaining the transfer step in the production method.
Figure 3:
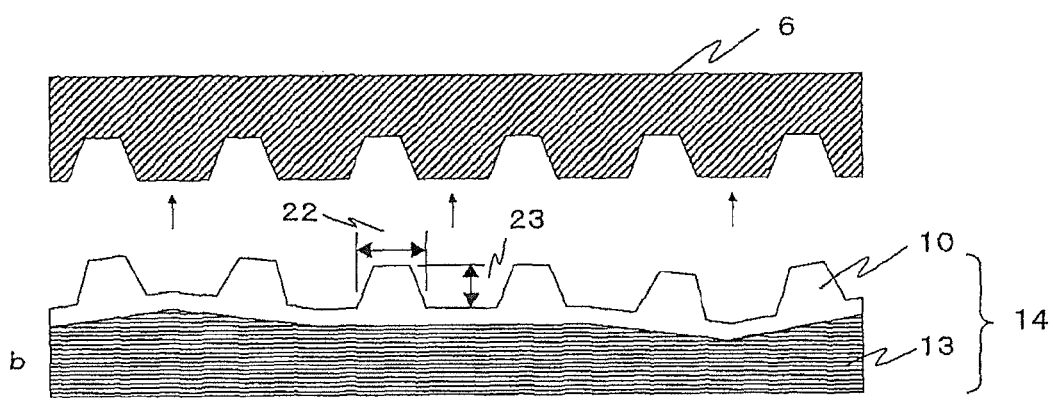

The transfer step is explained by referring to FIG. 3. In the transfer step, the transfer film 12 is disposed on the crystalline substrate 13, and the concave-convex film 10 is subsequently transferred onto the crystalline substrate 13 to constitute a crystalline substrate having a concave-convex film 14. In this figure, the concave-convex shape of the surface of the crystalline substrate shown by the numeral 13 receiving the concave-convex film 10 is exaggerated for the purpose of explanation. However, as in the case of FIG. 1b, this figure schematically shows the sapphire crystalline substrate (thickness, 50 to 1000 μm; TTV, 1 to 25 μm; LTV, 1 to 15 μm; warp, −25 to 25 μm) commonly used for the growth of the light-emitting layer of the light-emitting diode in which our method is used.

The crystalline substrate 13 is a substrate cut from a single crystal ingot, and preferably, the one mirror finished at least on one side where the concave-convex structure is formed.

The crystalline substrate 13 may have a thickness of 50 to 1000 μm, and more preferably 80 to 300 μm. When the thickness is less than 50 μm, the crystalline substrate 13 may become cracked. When the thickness is more than 1000 μm, the transfer film 12 may not sufficiently follow the surface of the crystalline substrate 13 when the transfer film 12 is disposed on the crystalline substrate 13 when the crystalline substrate 13 is warped, since the warp will not be corrected.

The material constituting the crystalline substrate 13 used in the production method is not particularly limited. Examples include oxide single crystals such as sapphire single crystal (Al2O3), spinel single crystal (MgAl2O4), ZnO single crystal, LiAlO2 single crystal, LiGaO2 single crystal, and MgO single crystal; SiC single crystal, Si single crystal, Si polycrystal, GaAs single crystal, InGaAlP single crystal; nitride semiconductor single crystals such as AlN single crystal and GaN single crystal; and boride single crystals such as ZrB2. Of these, the preferred is use of a crystalline substrate adapted for use in a semiconductor device, and in particular, use of sapphire single crystal, SiC single crystal, and GaN single crystal which are the crystalline substrates suitable for epitaxial growth of a semiconductor crystalline layer used for such purpose, in view of the demand for the microfabrication method of crystalline substrates for the growth of light emitting layer of the light emitting diode.

Preferably, the surface receiving the crystalline substrate 13 and/or the transfer film 12 used for the transfer step is previously subjected to washing and/or activation treatment.

The washing is the removal of organic contaminants on the surface, and the activation treatment is introduction of oxygen atom onto the surface. Conceivably, the reduction in the amount the organic contaminants on the surface by the washing and/or the introduction of the oxygen atom. Hence, increase in the hydroxy group on the surface by the activation treatment results in the increase of reactivity. The transfer property of the concave-convex film 10 is improved by the thus increased reactivity at the adhesion surface between the crystalline substrate 13 and the transfer film 12.

The method used for the washing and/or the activation treatment is not particularly limited. However, use of plasma treatment, UV (ultraviolet) ozone treatment, corona treatment, and the like is preferred since these methods are capable of simultaneously accomplishing the washing and the activation treatment. Of these, the preferred are the plasma treatment and the UV (ultraviolet) ozone treatment since these method can be readily conducted in a short period. The plasma treatment is a treatment conducted by applying a high voltage between two opposing electrodes to generate an electric field which creates the gas plasma used for the surface treatment. The gas used in this treatment is not particularly limited, and an exemplary preferable gas is the one containing 15 to 100% by mass of oxygen. The plasma treatment may be conducted at an atmospheric pressure, reduced pressure, or in the vacuum, and use of a reduced pressure is preferable in view of preventing the gas inactivation. The UV (ultraviolet) ozone treatment is a treatment wherein the surface is washed and activated by the ozone generated by the UV (ultraviolet). Use of a low pressure mercury lamp or xenon excimer lamp is preferable since a high energy light with short wavelength is required as the source of the UV (ultraviolet) light used for the ozone generation.

When the transfer film 12 is laminated on the crystalline substrate 13 in the transfer step, the surface of the transfer film 12 having the concave-convex film 10 formed thereon is brought in contact with the surface of the crystalline substrate 13 on which the concave-convex structure is to be formed. FIG. 3-a shows the step of disposing the transfer film 12 on the crystalline substrate 13.

The method used for such disposing of the transfer film 12 is not particularly limited. However, the preferred is use of a roller, nip roller, or press. The pressure applied in this step is preferably 1 kPa to 50 MPa, and more preferably 5 kPa to 10 MPa. When the pressure is less than 1 kPa, adhesion between the concave-convex film 10 and the crystalline substrate 13 will be insufficient, and selective peeling of the support film in the course of transfer may become difficult. When the pressure is in excess of 50 MPa, the crystalline substrate 13 may become cracked.

When the pressure is applied, a cushioning material is preferably used at least between the transfer film 12 and the pressure application mechanism. Use of the cushioning material improves followability of the transfer film 12 to the concave and convex shapes and warp on the surface of the crystalline substrate 13, and the adhesion is thereby improved. The cushioning material used is not particularly limited. However, exemplary cushioning materials include fluororubber, silicone rubber, ethylene propylene rubber, isobutylene isoprene rubber, acrylonitrile butadiene rubber, ethylene propylene diene rubber (EPDM), neoprene, chlorosulfonated polyethylene (CSM), urethane rubber, nitrile butadiene rubber (NBR), ebonite, any of such materials further processed by rubber manufacturers, and pressure-resistant hard resin with improved toughness (for example, polyester resin).

The laminating step is preferably conducted at a temperature of 20 to 200° C., and more preferably 50 to 150° C. When the temperature is lower than 20° C., softening of the support film 12 will be insufficient and followability on the surface of the crystalline substrate may be insufficient. When the temperature is in excess of 200° C., the support film 6 may be excessively softened and this may result in the excessive adhesion between the support film 6 and the concave-convex film 10 that may invite insufficient transfer property. The "transfer property" as used herein means the value obtained by dividing the area of the concave-convex film 10 transferred onto the crystalline substrate by the area of adhesion between the transfer film 6 and the crystalline substrate 13, and representing in percentage.

When the concave-convex film 10 is transferred onto the crystalline substrate 13 to form the crystalline substrate having a concave-convex film 14 in the transfer step, the support film 6 is peeled off the transfer film 12 which has been adhered to the surface of the crystalline substrate 13 on the side where the concave-convex structure is to be formed to thereby transfer the concave-convex film 10 onto the surface of the crystalline substrate 13 on the side where the concave-convex structure is to be formed. FIG. 3-b shows the crystalline substrate having a concave-convex film 14 after the peeling of the support film 6.

If desired, the concave-convex film 10 may be subjected to a chemical reaction before or after the peeling of the support film 6 by applying a UV (ultraviolet) beam or heat. This chemical reaction contributes to the improvement of the etching resistance of the concave-convex film 10. Hence, the dimensional precision of the concave-convex structure of the crystalline substrate having a concave-convex structure 15 improves.

When the concave-convex film 10 comprises a novolac material or a polyimide material, the heat treatment temperature is preferably at least 100° C. and up to 300° C., and more preferably at least 130° C. and up to 250° C. The temperature of lower than 100° C. may result in the insufficient progress of the chemical reaction while the temperature in excess of 300° C. may result in the damage of the shape of the concave-convex film 10.

When the concave-convex film 10 comprises a siloxane compound, the heat treatment temperature is preferably 150 to 1000° C., more preferably 180 to 900° C., and more preferably 200 to 800° C. The temperature of lower than 150° C. may result in the insufficient progress of the chemical reaction while the temperature in excess of 1200° C. may result in the damage of the shape and cracks of the concave-convex film 10.

In the heat treatment, a prebaking, namely, the baking at a low temperature for a predetermined period is preferably conducted before reaching the maximum temperature to thereby prevent damages in the shape of the concave-convex film 10.

The convex part of the concave-convex pattern of the crystalline substrate having a concave-convex film 14 is substantially the reverse of the concave part of the concave-convex pattern of the support film 6. More specifically, the preferable width range of the convex part of the concave-convex film 10 in the crystalline substrate having a concave-convex film 14 is the same as the width 8 of the concave part of the support film 6. The preferable range of the ratio of the height of the convex part to the width of the concave part of the concave-convex film 10 of the crystalline substrate having a concave-convex film 14 is the same as the range of the ratio d/w of d which is the depth 9 of the concave part to the w which is the width 8 of the concave part of the support film 6. The preferable range of the height of the convex part to the residual film thickness h of the concave-convex film 10 is the same as the range of the ratio d/h of the d which is the depth 9 of the concave part of the support film 6 to the residual film thickness h of the concave-convex film 10.

FIG. 3b shows the cross section of crystalline substrate having a concave-convex film 14. As shown in this figure, the width of the concave part of the concave-convex film 10 is the width of the skirt of the convex part, namely, the distance represented by the numeral 22 in FIG. 3b, and the height of the convex part is distance from the top of the convex part to the bottom of the convex part, namely, the part represented by the numeral 23 in FIG. 3b. As a result of the adhesion by following the convex and concave shapes or warp on the surface of the crystalline substrate 13, the width of the convex part and the height of the convex part of the concave-convex film 10 may alter in the range not exceeding 10% in relation to the dimension of the when they were in the form of the transfer film 12. In addition, as a result of the hardening shrinkage of the concave-convex film during the heat treatment of the crystalline substrate having a concave-convex film 14, the width of the convex part of the concave-convex film 10 may alter in the range not exceeding 50% in relation to the dimension of the when it was in the form of the transfer film 12, and the height of the convex part may reduce in the range not exceeding 50% in relation to the dimension of the when it was in the form of the transfer film 12.

Step (C): Etching Step

Figure 4:
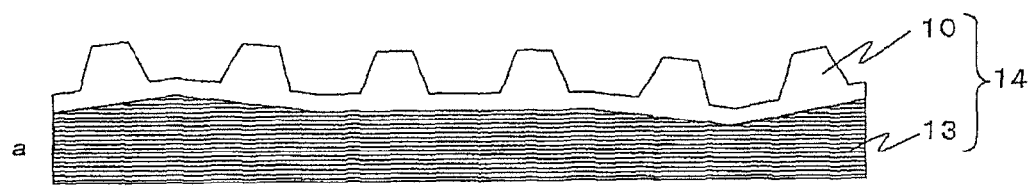
FIGS. 4-a, b and c shows schematic views for explaining the etching step in the production method.
Figure 4:
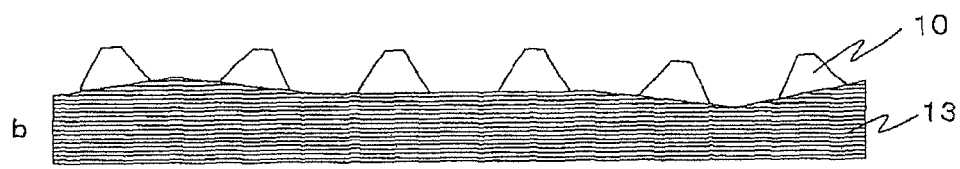
Figure 4:
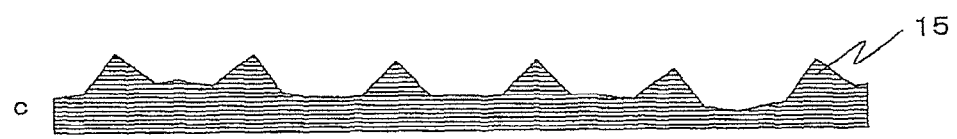

The etching step is explained by referring to FIG. 4. In the etching step, the crystalline substrate having a concave-convex film 14 is etched to form a crystalline substrate having a concave-convex structure 15. In this figure, the concave-convex form of the surface of the crystalline substrate shown by the numeral 13 receiving the concave-convex film 10 is exaggerated for the purpose of explanation. However, as in the case of FIG. 1b and FIG. 3, this figure schematically shows the sapphire crystalline substrate (thickness, 50 to 1000 μm; TTV, 1 to 25 μm; LTV, 1 to 15 μm; warp, −25 to 25 μm) commonly used for the growth of the light-emitting layer of the light-emitting diode.

When the concave-convex film 10 is made of (i) a material containing a novolac resin or a polyimide resin as its main component, the etching method used in the etching step is preferably a dry etching such as plasma etching, reactive ion etching (RIE), magnetron RIE, or ion milling. Of these, the preferred is use of the reactive ion etching (RIE) which is suitable for anisotropic etching of the crystalline substrate adapted for use in a semiconductor device and, in particular, sapphire single crystal, SiC single crystal, and GaN single crystal which are crystalline substrates suitable for epitaxial growth of a semiconductor crystalline layer, in view of the demand for the microfabrication method of crystalline substrates for the growth of light emitting layer of the light emitting diode.

The etching step by dry etching is constituted from the step of removing the residual film of the concave-convex film 10a transferred to the crystalline substrate having a concave-convex film 14 by etching (the step of FIG. 4-a to FIG. 4-b), and the step of etching the crystalline substrate to form a crystalline substrate having a concave-convex structure 15 (the step of FIG. 4-b to FIG. 4-c). These steps may be accomplished by using different gases or by the same gas.

The gas used for dry etching the crystalline substrate is not particularly limited. However, exemplary gases include chlorine (Cl) or halide gases such as $Cl_2$, $SiCl_4$, $BCl_3$, HBr, $SF_6$, $CHF_3$, $C_4F_8$, $CF_4$, $C_5F_8$, and $C_4F_6$, O-containing gases such as $O_2$, $CO_x$, and $NO_x$, and inert Ar. Of these, the preferred is use of a gas containing at least one of $Cl_2$, $BCl_3$, and $SiCl_4$ in the case of the sapphire single crystal or the GaN single crystal and a gas mixture at least containing the gas mixture prepared by adding an O-containing gas to a F-containing gas in the case of the SiC single crystal because of the high etching rate when applied to a crystalline substrate adapted for use in a semiconductor device, and in particular, sapphire single crystal, SiC single crystal, and GaN single crystal which are suitable for use as the crystalline substrate having the concave-convex structure 15 for epitaxial growth of a semiconductor crystalline layer used for such purpose, in view of the demand for the microfabrication method of crystalline substrates for the growth of light emitting layer of the light emitting diode.

The thus produced crystalline substrate having a concave-convex structure is divided for use as a chip. Such a chip is adapted for use as a light-emitting device as typically represented by a light-emitting diode.

When the concave-convex film 10 is made of (ii) a material containing a siloxane oligomer wherein the ratio of the number of silicon atoms to the total number of carbon, oxygen, and silicon atoms measured by X-ray photoelectron spectroscopy (XPS) is 5 to 33 atom %, the etching method used in the etching step is preferably a wet etching method.

The etching step by wet etching is constituted from the step of removing the residual film of the concave-convex film 10a transferred to the crystalline substrate having a concave-convex film 14 by etching (the step of FIG. 4-a to FIG. 4-b), and the step of etching the crystalline substrate to form a crystalline substrate having a concave-convex structure 15 (the step of FIG. 4-b to FIG. 4-c). These steps may be accomplished by using different etching solutions or by the same etching solution. The etching solution used in the step of wet etching of the residual film of the concave-convex film 10a is not particularly limited, and the preferred is the etching solution containing hydrofluoric acid. The etching solution used in the step of wet etching of the crystalline substrate is not particularly limited. However, in the case of the sapphire single crystal, the preferred is an etching solution containing at least one of hydrochloric acid, nitric acid, potassium hydroxide, sodium hydroxide, sulfuric acid, phosphoric acid, and a mixture of sulfuric acid and phosphoric acid; in the case of GaN single crystal, the preferred is an etching solution containing at least one of phosphoric acid, sulfuric acid, and potassium hydroxide; and in the case of SiC single crystal, the preferred is an etching solution containing potassium hydroxide.

EXAMPLES

Next, our methods are described in detail by referring to the Examples, which by no means limit the scope of this disclosure.

Evaluation of Properties (1) Surface Free Energy of the Support Film

The measurement was conducted by the following (1-1) to (1-3).

Figure 6:
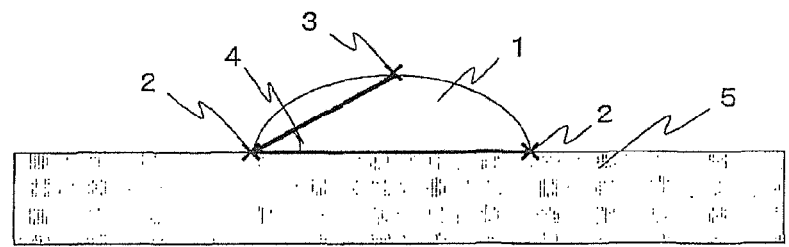
FIG. 6 is a schematic cross sectional view showing the position of the measurement points in the evaluation of the contact angle.

(1-1) Measurement of the Contact Angle of the Support Film and Calculation of the Provisional Value of the Surface Free Energy The measurement of the contact angle for the calculation of the surface free energy was conducted by sessile drop technique by manual three point measurement (θ/2 method) using contact angle meter model CA-X manufactured by Kyowa Interface Science Co., Ltd. First, the support film was placed on the sample holder so that the surface of the support film was horizontal. The liquid used for the measurement was pure water and, by using a syringe, a droplet of 0.4 μL of pure water was formed on the surface to be measured of the sample. Five seconds after droplet formation, the droplet image was stopped to measure the contact angle of the droplet. Since the contact angle was measured by the manual three point measurement, points 2 at opposite ends of the droplet 1 and peak point 3 of the droplet 1 were selected for the droplet 1 on the sample 5 as shown in FIG. 6 to calculate contact angle 4 of the droplet. The measurement was repeated 5 times, and the average was used for the contact angle. It is to be noted that the measurement was conducted again when the standard deviation of the contact angle in the 5 measurements was in excess of 3.0 since accurate value is not obtained if the surface to be measured had smudge or scratch. The contact angle was measured for 3 other types of liquids (ethylene glycol, formamide, and methylene iodide) by the same procedure as the one used for the pure water. The values shown in Table 1 were used for the surface energy component values of the liquid measured. The contact angle values measured for the 4 types liquids as described above were substituted in Equation (1) to calculate provisional values ($[\gamma_S^d]$SE, $[\gamma_S^p]$SE, and $[\gamma_S^h]$SE) of the surface free energy components of the support film.

$$(\gamma_S^d \cdot \gamma_L^d)^{1/2} + (\gamma_S^p \cdot \gamma_L^p)^{1/2} + (\gamma_S^h \cdot \gamma_L^h)^{1/2} = (1+\cos\theta)/2 \quad (1)$$

TABLE 1

| | Surface energy of each solvent (mN/m) | | | |
|---|---|---|---|---|
| | Dispersion force component | Polar force component | Hydrogen bond component | Total (surface free energy) |
| Pure water | 10.8 | 22.74 | 38.46 | 72.00 |
| Ethylene glycol | 17.5 | 4.69 | 25.96 | 48.15 |
| Formamide | 18.1 | 26.34 | 13.90 | 58.34 |
| Methylene iodide | 43.7 | 1.31 | 2.65 | 47.66 |

(1-2) Measurement of the Contact Angle of the Standard Film and Calculation of the Provisional Value of the Surface Free Energy The surface of a polyester film "Lumirror" (registered trademark) number U426 having a thickness of 100 μm manufactured by Toray Industries, Inc. was used as the standard film. For the surface of the standard film, provisional values for each component of the surface free energy of the standard film ($[\gamma_S^d]$RE, $[\gamma_S^p]$RE, and $[\gamma_S^h]$RE) were calculated under the same measuring environment and method as the above (i).

(1-3) Determination of the Surface Free Energy of the Support Film

The contact angle measured by the droplet method greatly varies by the environment of the measurement, and therefore, the results were corrected to remove the variation. With regard to the standard value for each component of the surface energy of the standard sample, the dispersion force component ($[\gamma_S^d]$RT) was 27.1 mN/m, the polar force component: ($[\gamma_S^p]$RT) was 10.8 mN/m, and the hydrogen bond component ($[\gamma_S^h]$RT) was 7.0 mN/m. These values were substituted in Formulae (2) to (4) to determine the value of each component ($[\gamma_S^d]$ST, $[\gamma_S^p]$ST, and $[\gamma_S^h]$ST) of the surface energy of the standard sample.

$$[\gamma_S^d]ST = [\gamma_S^d]SE - ([\gamma_S^d]RE - [\gamma_S^d]RT) \quad (2)$$

$$[\gamma_S^p]ST = [\gamma_S^p]SE - ([\gamma_S^p]RE - [\gamma_S^p]RT) \quad (3)$$

$$[\gamma_S^h]ST = [\gamma_S^h]SE - ([\gamma_S^h]RE - [\gamma_S^h]RT) \quad (4)$$

It is to be noted that the standard value for each component of the standard film ($[\gamma_S^d]$RT, $[\gamma_S^p]$RT, and $[\gamma_S^h]$RT) is the value obtained by calculating the average of each component of the surface free energy respectively calculated by the method of (1-1) under three environments of the room temperature of 30° C. and a relative humidity of 35%, the room temperature of 23° C. and a relative humidity of 32%, and the room temperature of 24° C. and a relative humidity 28%.

(2) Evaluation of the Concave-Convex Pattern of the Support Film

The procedure of evaluating the concave-convex pattern of the support film is described in the following (2-1) to (2-3).

(2-1) Width w of the Concave Part of the Support Film 12 concave parts on the surface of the support film having the concave-convex pattern were evaluated for their width of the upper part of the concave part by the method as described above, and the arithmetic average was used for the width w of the concave part of the support film. The measurement was conducted by using SEM (model S-3400N) manufactured by Hitachi High-Technologies Corporation. The magnification of the measurement was 50,000 folds when the width w of the concave part was at least 0.01 μm and less than 1 μm, 20,000 folds when the width w of the concave part was at least 1 μm and less than 2 μm, and 5,000 folds when the width was at least 2 μm and less than 5 μm.

(2-2) Depth d of the Concave Part of the Support Film 12 concave parts on the surface of the support film having the concave-convex pattern were evaluated by the method as described above, and the arithmetic average was used for the depth d of the concave part of the support film. The measurement was conducted by using an AFM (model NanoScope IIIa/MM) manufactured by Digital Instrument under the following conditions:

Scanner: AS-130 (J-Scanner)
Probe: model NCH-W, single crystal silicon (manufactured by NANOWORLD)
Scanning mode: tapping mode
Scanning range: 10 μm
Scanning speed: 0.3 Hz.

(2-3) Ratio d/w of the Support Film

The value obtained by dividing the depth d of the concave part of the support film by the width w of the concave part of the support film was used as the ratio d/w of the depth d of the concave part to the width w of the concave part of the support film.

(3) Evaluation of the Coating Property of the Concave-Convex Film on the Support Film Formation of the concave-convex film in the step of forming the transfer film was conducted by coating a coating solution containing the material of the concave-convex film with a spin coater Model 1H-DX2 manufactured by MIKASA Co., Ltd so that the average residual film thickness of the concave-convex film on the surface of the support film having the concave-convex pattern formed thereon had the dimension shown in Table 2. The coating property was evaluated by the following criteria:

A: good coating with no cissing
B: coating was available but with cissing
C: coating was unavailable.

(4) Evaluation of the Residual Film Thickness and the Like of the Concave-Convex Film The procedure used in evaluating the residual film thickness of the concave-convex film is described in (4-1) to (4-6) below.

(4-1) Preparation of the Sample Used in the Measurement

The concave-convex film was transferred to the glass substrate by the same method as the method described in (6-1) to (6-2) below to prepare the glass substrate having the concave-convex film. This substrate was divided, and a cross section having 50 or more repetition of the concave and convex shapes was formed. Ten such measurement samples were prepared for each level.

(4-2) Measurement of the Residual Film Thickness $h_0$ (Individual Value) of the Concave-Convex Film The measurement was conducted by using a SEM (model S-3400N) manufactured by Hitachi High-Technologies Corporation. The magnification was 50,000 folds when the residual film thickness was at least 0.01 μm and less than 0.5 μm, and 20,000 folds when the residual film thickness was at least 0.5 μm and 1 μm. The cross section was observed for 50 concave parts of the concave-convex film per sample, and minimum distance between the bottom of the concave part on the surface of the concave-convex film on the side of the support film and the surface of the concave-convex film opposite to the support film in the direction normal to the surface of the concave-convex film on the opposite side of the support film was regarded as the residual film thickness $h_0$ of the concave-convex film.

(4-3) Calculation of the Residual Film Thickness h (Average) of the Concave-Convex Film For 10 samples, average of the residual film thickness $h_0$ of the concave-convex film that had been determined for each sample was calculated, and this average was used for residual film thickness h of the concave-convex film.

(4-4) Difference in the Residual Film Thickness of the Concave-Convex Film

For 10 samples, average of the difference between the maximum value and the minimum value of the residual film thickness of the concave-convex film that had been determined for each sample was calculated, and this average was used for the difference in the residual film thickness of the concave-convex film.

(4-5) Evenness of the Residual Film Thickness of the Concave-Convex Film

The difference in the residual film thickness of the concave-convex film was divided by the residual film thickness h of the concave-convex film and represented in percentage. This value was used for the evenness of the residual film thickness of the concave-convex film.

(4-6) Ratio d/h of the Depth d of the Concave Part to the Residual Film Thickness h The depth d of the concave part of the support film was divided by the residual film thickness h of the concave-convex film. This value was used for the ratio d/h of the depth d of the concave part to the residual film thickness h.

(5) Elementary Analysis of the Concave-Convex Film by XPS (X-Ray Photoelectron Spectroscopy) (Evaluation of the Ratio of the Number of Silicon Atoms to the Total Number of Carbon, Oxygen, and Silicon Atoms)

The ratio of the number of silicon atoms to the total number of carbon, oxygen, and silicon atoms of the concave-convex film was measured by using X-ray photoelectron spectroscopy scanning microprobe PHI Quantera SXM (X ray source, Al Kα) manufactured by ULVAC-PHI, Inc. The resulting data was analyzed by correcting the peak corresponding to C1s binding energy to 284.4 eV, and using relative sensitivity factor (RSF) by utilizing the peak corresponding to Si2p near 102 to 103 eV and the peak corresponding to O1s near 530 to 535 eV.

(6) Evaluation of the Transfer Property of the Concave-Convex Film

In the transfer step, the concave-convex film was transferred from the support film to the crystalline substrate by the procedure of (6-1) to (6-2). The area percentage of the concave-convex film transfer was evaluated by the procedure of (6-3).

(6-1) Preparation of the Crystalline Substrate

Dust was blown off the mirror finished surface of the crystalline substrate by a blower, and the surface immersed in ethanol was ultrasonically cleaned by using three frequency ultrasonic cleaner (model VS-100III) manufactured by AS ONE Corporation at 45 kHz for 10 minutes. After the drying, the surface was subjected to a plasma treatment by using a bench top vacuum plasma apparatus (YHS-RW) manufactured by SAKIGAKE-Semiconductor Co., Ltd at 15,000 VAC for 5 minutes.

(6-2) the Step of Transferring the Concave-Convex Film from the Support Film to the Crystalline Substrate A laminate was produced by disposing a fluorine film "TOYOFLON" (registered trademark) number F (material, FEP; thickness 100 μm) manufactured by TORAY ADVANCED FILM Co., Ltd., the crystalline substrate, the transfer film, and the fluorine film "TOYOFLON" (registered trademark) number F (material, FEP; thickness 100 μm) manufactured by TORAY ADVANCED FILM Co., Ltd., and "KINYO BOARD" (registered trademark) number F200 manufactured by Kinyosha Co., Ltd. in this order. The laminate was prepared such that the mirror-finished surface of the crystalline substrate was in contact with the surface of the concave-convex film of the transfer film, and that the outer periphery of the transfer film extended beyond the outer periphery of the crystalline substrate. The laminate was then pressed by using "2 ton vacuum heater press" Model MKP-150TV-WH manufactured by Mikado Technos Co., Ltd. at a temperature of 25° C. and a pressure of 1 MPa for 30 seconds, and after stopping the pressing, the support film of the transfer film was peeled off at a temperature of 25° C. to thereby transfer the concave-convex film to the crystalline substrate. Next, the crystalline substrate having a concave-convex film was prepared by conducting a heat treatment with a hot plate. The conditions used in the hot plate heat treatment are described in each Example.

(6-3) Area Percentage of the Concave-Convex Film Transfer

The area percentage of the concave-convex film transfer was calculated by dividing the area of the concave-convex film that had been transferred onto the crystalline substrate by the area of the transfer film that had been in contact with the crystalline substrate, and the result was represented in percentage. The transfer property was evaluated "good" when the area percentage of the concave-convex film transfer was at least 50%, and the area having the concave-convex film transferred was evaluated for the following item.

(7) Observation of the Concave-Convex Structure on the Surface of the Crystalline Substrate The etching and the removal treatments of the concave-convex film of (7-1-1) or (7-1-2) were conducted depending on the material of the concave-convex film, and the observation of the concave-convex structure of (7-2) was conducted. It is to be noted that, in the evaluation, the area evaluated to be the area where the concave-convex film had been transferred was identified by mapping such area using the straight line-shaped notch (generally referred to as an "orientation flat") provided on the outer periphery for the purpose of registering the crystalline substrate for the reference.

(7-1-1) When the Concave-Convex Film is Made of a Material Containing a Novolac Resin or a Polyimide Resin as its Main Component Dry etching of the crystalline substrate having a concave-convex film was conducted by using a reactive ion etching system RIE-10N manufactured by SAMCO INC. by using $BCl_3$ gas, and subsequently, the concave-convex film was removed.

(7-1-2) when the Concave-Convex Film is Made of a Material Containing a Siloxane Oligomer Wherein the Ratio of the Number of Silicon Atoms to the Total Number of Carbon, Oxygen, and Silicon Atoms Measured by X-Ray Photoelectron Spectroscopy (XPS) is 5 to 33 Atom %

The crystalline substrate having a concave-convex film was subjected to wet etching with hydrofluoric acid, and the residual film of the concave-convex film was removed. Next, the crystalline substrate having a concave-convex film was subjected to wet etching by using a mixture containing sulfuric acid and phosphoric acid, and subsequently, the concave-convex film was removed.

(7-2) Observation of the Concave-Convex Structure

The surface of the crystalline substrate after removing the concave-convex film was observed with an AFM (model NanoScopeIIIa/MM) manufactured by Digital Instrument.

The evaluation was conducted as described below:

A: the concave-convex structure having the same pitch as the concave-convex film was formed in at least 90% of the area where the concave-convex film had been transferred.

B: the concave-convex structure was not formed, or the concave-convex structure having the same pitch as the concave-convex film that had been formed was less than 90% of the area where the concave-convex film had been transferred.

C: the area percentage of the concave-convex film transfer was low, or the etching was not conducted in view of the cracks that had been generated in the concave-convex film.

(8) General Evaluation

The general evaluation was conducted by the following criteria based on (6-3) evaluation of the area percentage of the concave-convex film transfer, and (7) evaluation of the concave-convex structure on the surface of the crystalline substrate:

A: area percentage of the concave-convex film transfer of at least 80%, and the concave-convex structure of the crystalline substrate of A.

B: area percentage of the concave-convex film transfer of at least 50% and less than 80%, and the concave-convex structure of the crystalline substrate of A.

C: area percentage of the concave-convex film transfer of less than 50%, and/or the concave-convex structure of the crystalline substrate of B or C.

Example 1

Preparation of the support film by thermal imprinting or UV imprinting (which is hereinafter referred to the step of forming the support film): A concave-convex pattern was formed on one surface of "ZEONOR" (registered trademark) (film type, ZF14) manufactured by ZEON CORPORATION which is a cyclic polyolefin resin film having a thickness of 100 µm by thermal imprinting to produce a support film having a concave-convex pattern on one surface. The mold used in the thermal imprinting was the one produced by Ni (nickel) electrocasting having a pattern wherein spheroids having a width of the convex part of 0.25 µm and a height of the convex part of 0.3 µm were discretely arranged at a pitch of the convex part of 0.3 µm (the pattern having such discretely arranged spheroids being hereinafter referred to as the "moth eye pattern"). The thermal imprinting was conducted by retaining the film at a press temperature of 180° C. and a press pressure of 2 MPa for 30 seconds, cooling the film to 100° C. or less, and opening the press to release the resulting support film from the mold.

Next, in the step of forming the transfer film, a novolac resin which is the material for the concave-convex film was diluted by PGPE (propylene glycol monopropyl ether) solvent to a solid concentration of 3% by mass to prepare a coating solution, and this coating solution was dropped on one surface of the support film having the concave-convex pattern and coated on the surface with a spin coater at 5000 rpm, and the coating was dried at 90° C. for 30 seconds by using a hot plate to form a concave-convex film on the surface of the support film having the concave-convex pattern to thereby form a transfer film. Excellent coating with no cissing was obtained.

Next, in the transfer step, the concave-convex film was transferred onto the sapphire single crystal substrate having a diameter of 2 inches by the method as described above in (6), and heat treatment was conducted by using a hot plate at the maximum temperature of 200° C. to produce the crystalline substrate having the concave-convex film. The area percentage of the transfer of the concave-convex film was 90%.

Next, the etching step was conducted by the dry etching of the crystalline substrate having the concave-convex structure by the method as described above in (7) according to (7-1-1) to remove the resist.

When the surface of the crystalline substrate was observed by AFM according to (7-2), formation of a concave-convex structure having a pitch the same as that of the concave-convex film could be confirmed.

Example 2

The procedure of Example 1 was repeated except that the solid concentration of the coating solution was changed to 10% by mass and the coating by the spin coater was conducted at 1500 rpm in the step of forming the transfer film to thereby form the concave-convex structure on the surface of the crystalline substrate.

Example 3

The procedure of Example 1 was repeated except that the solid concentration of the coating solution was changed to 5% by mass and the coating by the spin coater was conducted at 1500 rpm in the step of forming the transfer film to thereby form the concave-convex structure on the surface of the crystalline substrate.

Example 4

The procedure of Example 1 was repeated except that the mold used for the thermal imprinting in the step of forming the support film was changed to the one prepared by Ni (nickel) electrocasting having a pattern wherein pillars having a width of the convex part of 2 µm and a height of the convex part of 3 µm were discretely arranged at a pitch of the convex part of 6 µm (the pattern having such pillars discretely arranged being hereinafter referred to as the "pillar pattern"), and that the solid concentration of the coating solution was changed to 5% by mass, and the coating by the spin coater was conducted at 1500 rpm in the step of forming the transfer film to thereby form the concave-convex structure on the surface of the crystalline substrate.

Example 5

The procedure of Example 1 was repeated except that the mold used for the thermal imprinting in the step of forming the support film was changed to a Cu (copper) mold having a line-shaped prism pattern having a width of the convex part of 5 μm, a height of the convex part of 2.5 μm, and a pitch of the convex part of 5 μm, and that the solid concentration of the coating solution was changed to 5% by mass, and the coating by the spin coater was conducted at 1500 rpm in the step of forming the transfer film to thereby form the concave-convex structure on the surface of the crystalline substrate.

Example 6

The procedure of Example 1 was repeated except that the material of the concave-convex film was changed to a polyimide resin, the solid concentration of the coating solution was changed to 5% by weight, and the coating by the spin coater was conducted at 1500 rpm in the step of forming the transfer film to thereby form the concave-convex structure on the surface of the crystalline substrate.

Example 7

The procedure of Example 1 was repeated except that the mold used for the thermal imprinting in the step of forming the support film was changed to a Cu (copper) mold having a line-shaped prism pattern having a width of the convex part of 5 μm, a height of the convex part of 2.5 μm, and a pitch of the convex part of 5 μm, and that the material of the concave-convex film was changed to a polyimide resin, the solid concentration of the coating solution was changed to 5% by mass, and the coating by the spin coater was conducted at 1500 rpm in the step of forming the transfer film to thereby form the concave-convex structure on the surface of the crystalline substrate.

Example 8

In the step of forming the support film, "ARONIX" (registered trademark) UV3701 which is a UV curable acrylic resin manufactured by Toagosei Company, Limited was coated to a thickness of 5 μm on one surface of "Lumirror" (registered trademark) (film type, U34) which is a polyester film having a thickness of 100 μm manufactured by Toray Industries, Inc., and a concave-convex pattern was imparted by UV imprinting to thereby form a support film having a concave-convex pattern on the surface. The mold used in the UV imprinting was a Cu (copper) mold having a line-shaped prism pattern having a width of the convex part of 5 μm, a height of the convex part of 2.5 μm, and a pitch of the convex part of 5 μm.

In the step of forming the transfer film, the solid concentration of the coating solution was changed to 5% by mass, and the coating by the spin coater was conducted at 1500 rpm.

The procedure of Example 1 was repeated except for those as described above to thereby form the concave-convex structure on the surface of the crystalline substrate.

Example 9

The procedure of Example 1 was repeated except that the mold used for the thermal imprinting in the step of forming the support film was changed to a Si (silicon) mold having a line-shaped rectangular pattern having a width of the convex part of 100 μm, a height of the convex part of 0.5 μm, and a pitch of the convex part of 100.5 μm, and that the solid concentration of the coating solution was changed to 2% by mass, and the coating by the spin coater was conducted at 5000 rpm in the step of forming the transfer film to thereby form the concave-convex structure on the surface of the crystalline substrate.

Example 10

The procedure of Example 1 was repeated except that the mold used for the thermal imprinting in the step of forming the support film was changed to a Cu (copper) mold having a line-shaped prism pattern having a width of the convex part of 20 μm, a height of the convex part of 10 μm, and a pitch of the convex part of 20 μm, and that the solid concentration of the coating solution was changed to 15% by mass, and the coating by the spin coater was conducted at 1500 rpm in the step of forming the transfer film to thereby form the concave-convex structure on the surface of the crystalline substrate.

Example 11

The procedure of Example 1 was repeated except that the mold used for the thermal imprinting in the step of forming the support film was changed to a Si (silicon) mold having a line-shaped rectangular pattern having a width of the convex part of 0.05 μm, a height of the convex part of 0.05 μm, and a pitch of the convex part of 0.5 μm, and that the solid concentration of the coating solution was changed to 3% by mass, and the coating by the spin coater was conducted at 5000 rpm in the step of forming the transfer film to thereby form the concave-convex structure on the surface of the crystalline substrate.

Example 12

The procedure of Example 1 was repeated except that the mold used for the thermal imprinting in the step of forming the support film was changed to a Ni (nickel) electrocast mold having a moth eye pattern having a width of the convex part of 0.25 μm, a height of the convex part of 0.1 μm, and a pitch of the convex part of 0.3 μm to thereby form the concave-convex structure on the surface of the crystalline substrate.

Example 13

The procedure of Example 1 was repeated except that the mold used for the thermal imprinting in the step of forming the support film was changed to a Ni (nickel) electrocast mold having a moth eye pattern having a width of the convex part of 0.1 μm, a height of the convex part of 0.15 μm, and a pitch of the convex part of 0.3 μm to thereby form the concave-convex structure on the surface of the crystalline substrate.

Example 14

The procedure of Example 1 was repeated except that, in the step of forming the support film, the mold used in the thermal imprinting was changed to a Ni (nickel) electrocast mold having a moth eye pattern having a width of the convex part of 0.25 μm, a height of the convex part of 0.25 μm, and a pitch of the convex part of 0.3 μm; in the step of forming the transfer film, the material used for the concave-convex film was changed to OCNL 505 which is a siloxane sol manufactured by Tokyo Ohka Kogyo Co., Ltd., the solid concentration of the coating solution was changed to 5% by mass, and the drying using the hot plate was conducted at 90° C. for 10 seconds; and in the transfer step, the maximum temperature in the heat treatment was changed to 800° C. to thereby form the concave-convex structure on the surface of the crystalline substrate.

Example 15

The procedure of Example 14 was repeated except that the solid concentration of the coating solution was changed to 10% by mass in the step of forming the transfer film to thereby form the concave-convex structure on the surface of the crystalline substrate.

Example 16

The procedure of Example 14 was repeated except that the mold used in the thermal imprinting was changed to a Ni (nickel) electrocast mold having a moth eye pattern having a width of the convex part of 0.25 μm, a height of the convex part of 0.1 μm, and a pitch of the convex part of 0.3 μm in the step of forming the support film, and the solid concentration of the coating solution was changed to 4% by mass in the step of forming the transfer film to thereby form the concave-convex structure on the surface of the crystalline substrate.

Example 17

The procedure of Example 14 was repeated except that a film having a thickness of 60 μm prepared by melt extrusion of "TOPAS" (registered trademark) (film type, 6013) which is a cyclic polyolefin resin manufactured by POLYPLASTICS CO., LTD. was used in the step of forming the support film to thereby form the concave-convex structure on the surface of the crystalline substrate.

Example 18

The procedure of Example 14 was repeated except that "ARONIX" (registered trademark) UV3701 which is a UV curable acrylic resin manufactured by Toagosei Company, Limited was coated to a thickness of 5 μm on one surface of "Lumirror" (registered trademark) (film type, U34) which is a polyester film having a thickness of 100 μm manufactured by Toray Industries, Inc., and a concave-convex pattern was imparted by UV imprinting in the step of forming the support film to thereby form the concave-convex structure on the surface of the crystalline substrate.

Example 19

The procedure of Example 14 was repeated except that, in the step of forming the transfer film, the material used for the concave-convex film was changed to a siloxane sol prepared by condensing tetramethoxysilane and the drying using the hot plate was conducted at 90° C. for 90 seconds to thereby form the concave-convex structure on the surface of the crystalline substrate.

Example 20

The procedure of Example 14 was repeated except that, in the step of forming the transfer film, the material used for the concave-convex film was changed to a siloxane sol prepared by condensing phenyltriethoxysilane and the drying using the hot plate was conducted at 90° C. for 90 seconds to thereby form the concave-convex structure on the surface of the crystalline substrate.

Example 21

The procedure of Example 14 was repeated except that, in the step of forming the transfer film, the material used for the concave-convex film was changed to a siloxane sol prepared by condensing phenyltriethoxysilane and the drying using the hot plate was conducted at 90° C. for 90 seconds to thereby form the concave-convex structure on the surface of the crystalline substrate.

Example 22

The procedure of Example 14 was repeated except that, in the step of forming the transfer film, the material used for the concave-convex film was changed to a siloxane sol prepared by condensing tetramethoxysilane and the drying using the hot plate was conducted at 90° C. for 90 seconds to thereby form the concave-convex structure on the surface of the crystalline substrate.

Example 23

The procedure of Example 14 was repeated except that, in the step of forming the transfer film, the material used for the concave-convex film was changed to a siloxane sol prepared by condensing phenyltriethoxysilane and the drying using the hot plate was conducted at 90° C. for 90 seconds to thereby form the concave-convex structure on the surface of the crystalline substrate.

Example 24

The procedure of Example 1 was repeated except that, in the step of forming the support film, "SEIKABEAM" EX-T003 which is a UV curable acrylic resin manufactured by Dainichiseika Color & Chemicals Mfg. Co., Ltd was coated to a thickness of 5 μm on one surface of "Lumirror" (registered trademark) (film type, U34) which is a polyester film having a thickness of 100 μm manufactured by Toray Industries, Inc., and a concave-convex pattern was imparted by UV imprinting to thereby form the concave-convex structure on the surface of the crystalline substrate.

Example 25

The procedure of Example 1 was repeated except that a resin prepared by adding 0.2 part by mass of DYK-340 manufactured by BYK Japan KK to 100 parts by mass of "SEIKA-BEAM" EX-T003 which is a UV curable acrylic resin manufactured by Dainichiseika Color & Chemicals Mfg. Co., Ltd was coated to a thickness of 5 μm on one surface of "Lumirror" (registered trademark) (film type, U34) which is a polyester film having a thickness of 100 μm manufactured by Toray Industries, Inc., and a concave-convex pattern was imparted by UV imprinting in the step of forming the support film to thereby form the concave-convex structure on the surface of the crystalline substrate.

Example 26

The procedure of Example 1 was repeated except that a resin prepared by adding 3 parts by mass of IRGACURE 250 manufactured by Ciba Japan K.K. to 100 parts by mass of ZX-101 which is a UV curable acrylic resin manufactured by Fuji Kasei Kogyo K.K. was coated to a thickness of 5 μm on one surface of "Lumirror" (registered trademark) (film type, U34) which is a polyester film having a thickness of 100 μm manufactured by Toray Industries, Inc., and a concave-convex pattern was imparted by UV imprinting in the step of forming the support film to thereby form the concave-convex structure on the surface of the crystalline substrate.

Example 27

The procedure of Example 1 was repeated except that a resin prepared by adding 0.5 part by mass of DYK-340 manufactured by BYK Japan KK to 100 parts by mass of "SEIKA-BEAM" EX-T003 which is a UV curable acrylic resin manufactured by Dainichiseika Color & Chemicals Mfg. Co., Ltd was coated to a thickness of 5 μm on one surface of "Lumirror" (registered trademark) (film type, U34) which is a polyester film having a thickness of 100 μm manufactured by Toray Industries, Inc., and a concave-convex pattern was imparted by UV imprinting in the step of forming the support film to thereby form the concave-convex structure on the surface of the crystalline substrate.

Comparative Example 1

The procedure of Example 1 was repeated except that the mold used for the thermal imprinting in the step of forming the support film was changed to a Ni (nickel) electrocast mold having a moth eye pattern having a width of the convex part of 0.2 μm and a height of the convex part of 0.35 μm at a pitch of the convex part of 0.3 μm, and that the solid concentration of the coating solution was changed to 5% by mass, and the coating by the spin coater was conducted at 1500 rpm in the step of forming the transfer film to thereby form the transfer film. Excellent coating with no cissing was obtained.

Next, when the concave-convex film was transferred by the method described in (6) above in the transfer step, the area percentage of the concave-convex film transfer was 5%.

Since the ratio d/w of the depth d of the concave part to the width w of the concave part of the support film was as high as 1.8, the peelability between the support film and the concave-convex film in the transfer step was poor, and the transfer to the crystalline substrate became difficult.

Comparative Example 2

The procedure of Example 1 was repeated except that the mold used for the thermal imprinting in the step of forming the support film was changed to a Cu (copper) mold having a line-shaped prism pattern having a width of the convex part of 25 μm, a height of the convex part of 12.5 μm, and a pitch of the convex part of 25 μm, and that the solid concentration of the coating solution was changed to 15% by mass, and the coating by the spin coater was conducted at 1500 rpm in the step of forming the transfer film to thereby form the transfer film. Excellent coating with no cissing was obtained.

Next, when the concave-convex film was transferred by the method described in (6) above in the transfer step, cracks were generated in the concave-convex film by the heat treatment and the area percentage of the transfer of the concave-convex film was 85%.

Presumably, the cracks were generated because of the depth of the concave part of the support film as large as 12.5 μm which resulted in the formation of the thick concave-convex film.

Comparative Example 3

The procedure of Example 1 was repeated except that the solid concentration of the coating solution was changed to 2% by mass and the coating by the spin coater was conducted at 5000 rpm in the step of forming the transfer film to thereby form the transfer film. In the step of forming the transfer film, excellent coating with no cissing was obtained.

Next, when the concave-convex film was transferred by the method described in (6) above in the transfer step, the area percentage of the concave-convex film transfer was 15%.

In this case, the residual film of the concave-convex film in the transfer film was thin, and some parts of the support film surface remained uncovered by the residual film of the concave-convex film. As a consequence, in such parts, adhesion between the sapphire and the concave-convex film was absent in the transfer step, and this resulted in the difficulty of the transfer of the concave-convex film to the crystalline substrate.

Comparative Example 4

The procedure of Example 1 was repeated except that the solid concentration of the coating solution was changed to 20% by mass and the coating by the spin coater was conducted at 1500 rpm in the step of forming the transfer film to thereby form the concave-convex structure on the surface of the crystalline substrate. In the step of forming the transfer film, excellent coating with no cissing was obtained.

The area percentage of the transfer of the concave-convex film in the transfer step was 90%.

When the surface of the crystalline substrate was examined by AFM, failure in the formation of the concave-convex structure on the surface of the crystalline substrate was confirmed.

In this case, the residual film of the concave-convex film in the transfer film was thick, and flattening of the convex parts proceeded in the course of removing the residual film of the concave-convex film in the etching step. Presumably, this resulted in the failure of the formation of the concave-convex structure in the step of etching the crystalline substrate.

Comparative Example 5

The procedure of Example 1 was repeated except that the solid concentration of the coating solution was changed to 10% by mass and the coating by the spin coater was conducted at 500 rpm in the step of forming the transfer film to thereby form the concave-convex structure on the surface of the crystalline substrate. In the step of forming the transfer film, excellent coating with no cissing was obtained. The area percentage of the transfer of the concave-convex film in the transfer step was 90%.

When the surface of the crystalline substrate was examined by AFM, failure in the formation of the concave-convex structure in some parts of the surface of the crystalline substrate was confirmed.

In this case, evenness of the residual film thickness of the concave-convex film in the transfer film was insufficient, and in the parts where the concave-convex film was thick, narrowing of the convex parts proceeded in the course of removing the residual film of the concave-convex film in the etching step. As a consequence, the concave-convex structure was not formed in such parts in the step of etching the crystalline substrate.

Comparative Example 6

The procedure of Example 1 was repeated except that the mold used in the thermal imprinting in the step of forming the support film was changed to a glass substrate having a gold particle colloid monolayer film having a pattern wherein hemispheres having a width of the convex part of 0.03 μm and a height of the convex part of 0.02 μm were discretely arranged, and that the solid concentration of the coating solution was changed to 1% by mass, and the coating by the spin coater was conducted at 5000 rpm in the step of forming the transfer film to thereby form the transfer film. In the step of forming the transfer film, excellent coating with no cissing was obtained.

The area percentage of the transfer of the concave-convex film in the transfer step was 90%.

When the surface of the crystalline substrate was examined by AFM, failure in the formation of the concave-convex structure on the surface of the crystalline substrate was confirmed.

In this case, the depth of the concave part of the support film was as low as 0.02 μm, and flattening of the convex parts proceeded in the course of removing the residual film of the concave-convex film in the etching step. Presumably, this resulted in the failure of the formation of the concave-convex structure in the step of etching the crystalline substrate.

Comparative Example 7

The procedure of Example 1 was repeated except that the mold used for the thermal imprinting in the step of forming the support film was changed to a Si (silicon) mold having a line-shaped rectangular pattern having a width of the convex part of 250 μm, a height of the convex part of 2 μm, and a pitch of the convex part of 500 μm, and that the solid concentration of the coating solution was changed to 10% by mass, and the coating by the spin coater was conducted at 1500 rpm in the step of forming the transfer film to thereby form the concave-convex structure on the surface of the crystalline substrate. Excellent coating with no cissing was obtained.

The area percentage of the transfer of the concave-convex film in the transfer step was 20%.

In this case, the width w of the concave part of the support film was as wide as 250 μm, and presumably, this resulted in the loss of peelability of the concave-convex film from the support film in the transfer step and invited the difficulty of the transfer of the concave-convex film to the crystalline substrate.

Comparative Example 8

The procedure of Example 14 was repeated except that, in the step of forming the transfer film, the material used for the concave-convex film was changed to a siloxane sol prepared by condensing tetramethoxysilane and the drying using the hot plate was conducted at 90° C. for 90 seconds to thereby form the concave-convex structure on the surface of the crystalline substrate. Excellent coating with no cissing was obtained.

The area percentage of the transfer of the concave-convex film in the transfer step was 20%.

In this case, proportion of the number of silicon atoms in the concave-convex film was as high as 33.1 atom %, and presumably, this resulted in the weak adhesion between the concave-convex film and the crystalline substrate in the transfer step and this resulted in the difficulty of the transfer of the concave-convex film to the crystalline substrate.

Comparative Example 9

The procedure of Example 14 was repeated except that, in the step of forming the transfer film, the material used for the concave-convex film was changed to a siloxane sol prepared by condensing phenyltriethoxysilane and the drying using the hot plate was conducted at 90° C. for 90 seconds to thereby form the concave-convex structure on the surface of the crystalline substrate. Excellent coating with no cissing was obtained.

The area percentage of the transfer of the concave-convex film in the transfer step was 100%.

When the surface of the crystalline substrate was examined by AFM, failure in the formation of the concave-convex structure on the surface of the crystalline substrate was confirmed.

In this case, proportion of the number of silicon atoms in the concave-convex film was as low as 4 atom %, and the concave-convex film was eroded before functioning as the etching mask in the etching step, and presumably, this resulted in the failure of the formation of the concave-convex structure in the etching step of the crystalline substrate.

The results as described above are summarized in Table 2.

TABLE 2-1

| | Transfer film formation step | | | | | | | | |
|---|---|---|---|---|---|---|---|---|---|
| | Surface of the support film having the concave-convex pattern | | | | | Concave-convex film | | | |
| | Depth d of the concave part (μm) | Width w of the concave part (μm) | Ratio of the concave part d/w | Surface free energy (mN/m) | Material †1 | Residual film thickness h (μm) | Evenness of the residual film thickness (%) | Material †2 | Si atom content (atom %) |
| Ex. 1 | 0.3 | 0.25 | 1.2 | 46.3 | COP | 0.01 | 13 | NV | — |
| Ex. 2 | 0.3 | 0.25 | 1.2 | 46.3 | COP | 0.58 | 8 | NV | — |
| Ex. 3 | 0.3 | 0.25 | 1.2 | 46.3 | COP | 0.45 | 25 | NV | — |
| Ex. 4 | 3 | 2 | 1.5 | 48.4 | COP | 0.41 | 9 | NV | — |
| Ex. 5 | 2.5 | 5 | 0.5 | 40.1 | COP | 0.50 | 11 | NV | — |
| Ex. 6 | 0.3 | 0.25 | 1.2 | 46.3 | COP | 0.37 | 15 | PI | — |
| Ex. 7 | 2.5 | 5 | 0.5 | 40.1 | COP | 1.0 | 18 | PI | — |
| Ex. 8 | 2.5 | 5 | 0.5 | 44.3 | AC | 0.75 | 12 | NV | — |
| Ex. 9 | 0.5 | 100 | 0.005 | 40.2 | COP | 0.03 | 14 | NV | — |
| Ex. 10 | 10 | 20 | 0.5 | 41.9 | COP | 0.86 | 9 | NV | — |
| Ex. 11 | 0.05 | 0.05 | 1.0 | 42.3 | COP | 0.04 | 12 | NV | — |

TABLE 2-1-continued

| | | | | | | | | | |
|---|---|---|---|---|---|---|---|---|---|
| Ex. 12 | 0.1 | 0.25 | 0.4 | 46.3 | COP | 0.11 | 9 | NV | — |
| Ex. 13 | 0.15 | 0.1 | 1.5 | 46.3 | COP | 0.09 | 7 | NV | — |

| | Transfer film formation step | Transfer step | | Etching step | |
|---|---|---|---|---|---|
| | Concave-convex film Coating property | Transfer film Ratio of the concave part depth to the residual film thickness d/h | Crystalline substrate Material | Concave-convex film Transfer area rate (%) | Crystalline substrate Concave-convex structure | General evaluation |
| Ex. 1 | A | 30 | Sapphire | 90 | A | A |
| Ex. 2 | A | 0.5 | Sapphire | 70 | A | B |
| Ex. 3 | A | 0.7 | Sapphire | 60 | A | B |
| Ex. 4 | A | 7.3 | Sapphire | 80 | A | A |
| Ex. 5 | A | 5.0 | Sapphire | 90 | A | A |
| Ex. 6 | A | 0.8 | Sapphire | 90 | A | A |
| Ex. 7 | A | 2.5 | Sapphire | 70 | A | B |
| Ex. 8 | A | 3.3 | Sapphire | 65 | A | B |
| Ex. 9 | A | 16.7 | Sapphire | 70 | A | B |
| Ex. 10 | A | 11.6 | Sapphire | 70 | A | B |
| Ex. 11 | A | 1.3 | Sapphire | 70 | A | B |
| Ex. 12 | A | 0.9 | Sapphire | 90 | A | A |
| Ex. 13 | A | 1.7 | Sapphire | 90 | A | A |

†1 Cyclic polyolefin resin: COP Acrylic resin: AC
†2 Novolac resin: NV Polyimide resin: PI Siloxane: SI

TABLE 2-2

| | Transfer film formation step | | | | | | | | |
|---|---|---|---|---|---|---|---|---|---|
| | Surface of the support film having the concave-convex pattern | | | | | Concave-convex film | | | |
| | Depth d of the concave part (μm) | Width w of the concave part (μm) | Ratio of the concave part d/w | Surface free energy (mN/m) | Material †1 | Residual film thickness h (μm) | Evenness of the residual film thickness (%) | Material †2 | Si atom content (atom %) |
| Ex. 14 | 0.25 | 0.25 | 1.0 | 45.7 | COP | 0.073 | 22 | SI | 30 |
| Ex. 15 | 0.25 | 0.25 | 1.0 | 45.7 | COP | 0.425 | 12 | SI | 30 |
| Ex. 16 | 0.10 | 0.25 | 0.4 | 43.1 | COP | 0.037 | 15 | SI | 30 |
| Ex. 17 | 0.25 | 0.25 | 1.0 | 51.1 | COP | 0.056 | 18 | SI | 30 |
| Ex. 18 | 0.25 | 0.25 | 1.0 | 47.8 | AC | 0.11 | 15 | SI | 30 |
| Ex. 19 | 0.25 | 0.25 | 1.0 | 45.7 | COP | 0.104 | 19 | SI | 32 |
| Ex. 20 | 0.25 | 0.25 | 1.0 | 45.7 | COP | 0.12 | 15 | SI | 11 |
| Ex. 21 | 0.25 | 0.25 | 1.0 | 45.7 | COP | 0.09 | 15 | SI | 8 |
| Ex. 22 | 0.25 | 0.25 | 1.0 | 45.7 | COP | 0.1 | 9 | SI | 33 |
| Ex. 23 | 0.25 | 0.25 | 1.0 | 45.7 | COP | 0.08 | 14 | SI | 5 |
| Ex. 24 | 0.3 | 0.25 | 1.2 | 60 | AC | 0.31 | 13 | NV | — |
| Ex. 25 | 0.3 | 0.25 | 1.2 | 25 | AC | 0.25 | 11 | NV | — |
| Ex. 26 | 0.3 | 0.25 | 1.2 | 70 | AC | 0.37 | 15 | NV | — |
| Ex. 27 | 0.3 | 0.25 | 1.2 | 23 | AC | 0.19 | 14 | NV | — |

| | Transfer film formation step | Transfer step | | Etching step | |
|---|---|---|---|---|---|
| | Concave-convex film Coating property | Transfer film Ratio of the concave part depth to the residual film thickness d/h | Crystalline substrate Material | Concave-convex film Transfer area rate (%) | Crystalline substrate Concave-convex structure | General evaluation |
| Ex. 14 | A | 3.4 | Sapphire | 70 | A | B |
| Ex. 15 | A | 0.6 | Sapphire | 60 | A | B |
| Ex. 16 | A | 2.7 | Sapphire | 90 | A | A |
| Ex. 17 | A | 4.5 | Sapphire | 70 | A | B |
| Ex. 18 | A | 2.3 | Sapphire | 80 | A | A |
| Ex. 19 | A | 2.4 | Sapphire | 85 | A | A |
| Ex. 20 | A | 2.1 | Sapphire | 90 | A | A |
| Ex. 21 | A | 2.8 | Sapphire | 95 | A | A |
| Ex. 22 | A | 2.5 | Sapphire | 70 | A | B |
| Ex. 23 | A | 3.1 | Sapphire | 50 | A | B |
| Ex. 24 | A | 1.0 | Sapphire | 80 | A | A |
| Ex. 25 | A | 1.2 | Sapphire | 80 | A | A |

TABLE 2-2-continued

| | | | | | | |
|---|---|---|---|---|---|---|
| Ex. 26 | A | 0.8 | Sapphire | 70 | A | B |
| Ex. 27 | A | 1.6 | Sapphire | 70 | A | B |

†1 Cyclic polyolefin resin: COP Acrylic resin: AC

†2 Novolac resin: NV Polyimide resin: PI Siloxane: SI

TABLE 2-3

| | Transfer film formation step | | | | | | | |
|---|---|---|---|---|---|---|---|---|
| | Surface of the support film having the concave-convex pattern | | | | | Concave-convex film | | |
| | Depth d of the concave part (μm) | Width w of the concave part (μm) | Ratio of the concave part d/w | Surface free energy (mN/m) | Material †1 | Residual film thickness h (μm) | Evenness of the residual film thickness (%) | Material †2 | Si atom content (atom %) |
| Comp. Ex. 1 | 0.35 | 0.2 | 1.8 | 49.2 | COP | 0.45 | 17 | NV | — |
| Comp. Ex. 2 | 12.5 | 25 | 0.5 | 40.9 | COP | 0.53 | 10 | NV | — |
| Comp. Ex. 3 | 0.3 | 0.25 | 1.2 | 46.3 | COP | 0.006 | — | NV | — |
| Comp. Ex. 4 | 0.3 | 0.25 | 1.2 | 46.3 | COP | 2.5 | 3 | NV | — |
| Comp. Ex. 5 | 0.3 | 0.25 | 1.2 | 46.3 | COP | 1.4 | 34 | NV | — |
| Comp. Ex. 6 | 0.02 | 0.03 | 0.7 | 40.9 | COP | 0.03 | 12 | NV | — |
| Comp. Ex. 7 | 2 | 250 | 0.008 | 40.6 | COP | 0.8 | 6 | NV | — |
| Comp. Ex. 8 | 0.25 | 0.25 | 1.00 | 45.7 | COP | 0.11 | 14 | SI | 33.1 |
| Comp. Ex. 9 | 0.25 | 0.25 | 1.00 | 45.7 | COP | 0.18 | 21 | SI | 4 |

| | Transfer film formation step | Transfer film formation step | Transfer step | Transfer step | Etching step | |
|---|---|---|---|---|---|---|
| | Concave-convex film Coating property | Transfer film Ratio of the concave part depth to the residual film thickness d/h | Crystalline substrate Material | Concave-convex film Transfer area rate (%) | Crystalline substrate Concave-convex structure | General evaluation |
| Comp. Ex. 1 | A | 0.78 | Sapphire | 5 | C | C |
| Comp. Ex. 2 | A | 23.6 | Sapphire | 85 | C | C |
| Comp. Ex. 3 | A | 50 | Sapphire | 15 | C | C |
| Comp. Ex. 4 | A | 0.1 | Sapphire | 90 | B | C |
| Comp. Ex. 5 | A | 0.2 | Sapphire | 90 | B | C |
| Comp. Ex. 6 | A | 0.7 | Sapphire | 90 | B | C |
| Comp. Ex. 7 | A | 2.5 | Sapphire | 20 | C | C |
| Comp. Ex. 8 | A | 2.3 | Sapphire | 20 | C | C |
| Comp. Ex. 9 | A | 1.4 | Sapphire | 100 | B | C |

†1 Cyclic polyolefin resin: COP Acrylic resin: AC

†2 Novolac resin: NV Polyimide resin: PI Siloxane: SI

The invention claimed is:

1. A method of producing a crystalline substrate having a concave-convex structure comprising:
   (A) forming a transfer film by forming a concave-convex film on a support film on a surface having a concave-convex pattern thereon so that thickness h of a residual film of the concave-convex film is 0.01 to 1 µm, the concave-convex pattern of the support film having concave parts with a width w of 0.05 to 100 µm, a depth d of 0.05 to 10 µm, and a ratio d/w of the depth d of a concave part to the width w of the concave part of up to 1.5,
   (B) disposing the transfer film on the crystalline substrate, and transferring the concave-convex film onto the crystalline substrate to produce a crystalline substrate having the concave-convex film thereon, and
   (C) etching the crystalline substrate having the concave-convex film thereon to form a concave-convex structure on the surface of a crystalline substrate.

2. The method according to claim 1, wherein the ratio (d/h) of the depth d of the concave part to the thickness h of the residual film is at least 0.5.

3. The method according to claim 1, wherein the concave-convex film is formed on the surface of the support film having the concave-convex pattern so that evenness of the residual film thickness is up to 25%.

4. The method according to claim 1, wherein the concave-convex film contains a novolac resin or a polyimide resin as its main component.

5. The method according to claim 4, wherein the crystalline substrate having the concave-convex film is etched by dry etching.

6. The method according to claim 1, wherein the concave-convex film contains a siloxane oligomer, and ratio of the number of silicon atoms to the total number of carbon, oxygen, and silicon atoms measured by X-ray photoelectron spectroscopy (XPS) is 5 to 33 atom %.

7. The method according to claim 6, wherein the crystalline substrate having the concave-convex film is etched by wet etching.

8. The method according to claim 1, wherein surface free energy of the surface of the support film having the concave-convex pattern is 23 to 70 mN/m.

9. The method according to claim 1, wherein the surface of the support film having the concave-convex pattern contains a polyolefin resin or an acrylic resin as its main component.

10. A light-emitting device having a chip which has been divided from the crystalline substrate having a concave-convex structure produced by the method of claim 1.

11. The method according to claim 2, wherein the concave-convex film is formed on the surface of the support film having the concave-convex pattern so that evenness of the residual film thickness is up to 25%.

12. The method according to claim 2, wherein the concave-convex film contains a novolac resin or a polyimide resin as its main component.

13. The method according to claim 3, wherein the concave-convex film contains a novolac resin or a polyimide resin as its main component.

14. The method according to claim 2, wherein the concave-convex film contains a siloxane oligomer, and ratio of the number of silicon atoms to the total number of carbon, oxygen, and silicon atoms measured by X-ray photoelectron spectroscopy (XPS) is 5 to 33 atom %.

15. The method according to claim 3, wherein the concave-convex film contains a siloxane oligomer, and ratio of the number of silicon atoms to the total number of carbon, oxygen, and silicon atoms measured by X-ray photoelectron spectroscopy (XPS) is 5 to 33 atom %.

16. The method according to claim 2, wherein surface free energy of the surface of the support film having the concave-convex pattern is 23 to 70 mN/m.

17. The method according to claim 3, wherein surface free energy of the surface of the support film having the concave-convex pattern is 23 to 70 mN/m.

18. The method according to claim 4, wherein surface free energy of the surface of the support film having the concave-convex pattern is 23 to 70 mN/m.

19. The method according to claim 5, wherein surface free energy of the surface of the support film having the concave-convex pattern is 23 to 70 mN/m.

20. The method according to claim 6, wherein surface free energy of the surface of the support film having the concave-convex pattern is 23 to 70 mN/m.

* * * * *